(12) United States Patent
Endo et al.

(10) Patent No.: US 12,400,920 B2
(45) Date of Patent: Aug. 26, 2025

(54) FLEXIBLE COMPONENT SUPPORT AND DISPLAY DEVICE

(71) Applicant: SEMICONDUCTOR ENERGY LABORATORY CO., LTD., Atsugi (JP)

(72) Inventors: Akio Endo, Kanagawa (JP); Naoto Kusumoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 500 days.

(21) Appl. No.: 17/603,396

(22) PCT Filed: Apr. 6, 2020

(86) PCT No.: PCT/IB2020/053247
§ 371 (c)(1),
(2) Date: Oct. 13, 2021

(87) PCT Pub. No.: WO2020/212797
PCT Pub. Date: Oct. 22, 2020

(65) Prior Publication Data
US 2022/0181222 A1    Jun. 9, 2022

(30) Foreign Application Priority Data

Apr. 19, 2019  (JP) .................................. 2019-079998
May 9, 2019   (JP) .................................. 2019-088911

(51) Int. Cl.
*H01L 23/13*     (2006.01)
(52) U.S. Cl.
CPC ................................. *H01L 23/13* (2013.01)

(58) Field of Classification Search
CPC ........ G09F 9/301; H05K 1/148; H10K 77/111
See application file for complete search history.

(56) References Cited

U.S. PATENT DOCUMENTS

| | | | |
|---|---|---|---|
| 7,027,110 B2 | 4/2006 | Akiyama et al. |
| 7,032,984 B2 | 4/2006 | Kim et al. |

(Continued)

FOREIGN PATENT DOCUMENTS

| | | | |
|---|---|---|---|
| CN | 001383503 A | 12/2002 |
| CN | 106463079 A | 2/2017 |

(Continued)

OTHER PUBLICATIONS

International Search Report (Application No. PCT/IB2020/053247) Dated Jul. 28, 2020 (7 pages).

(Continued)

*Primary Examiner* — Moazzam Hossain
(74) *Attorney, Agent, or Firm* — NIXON PEABODY LLP; Jeffrey L. Costellia

(57) ABSTRACT

A support for supporting a flexible component is provided. A flexible component support can be folded without decreasing the reliability of the flexible component. The support has a region where two different hinges overlap each other, and bending operation in the region can be performed only in one direction from a flat surface state. Accordingly, even in the case where unintended bending stress is applied to the region in an opposite direction, the flexible component or the support can be protected. In addition, the two hinges can each include position correction mechanism, which enables stable bending operation.

9 Claims, 25 Drawing Sheets

(56) References Cited

U.S. PATENT DOCUMENTS

| | | |
|---|---|---|
| 7,311,366 B2 | 12/2007 | Kim et al. |
| 8,369,075 B2 | 2/2013 | Huang |
| 8,837,126 B2 | 9/2014 | Cho et al. |
| 8,988,405 B2 | 3/2015 | Endo |
| 9,337,434 B2 | 5/2016 | Lindblad |
| 9,395,070 B2 | 7/2016 | Endo |
| 9,810,406 B2 | 11/2017 | Endo |
| 9,876,059 B2 | 1/2018 | Yanagisawa et al. |
| 9,891,725 B2 | 2/2018 | Lindblad |
| 9,923,156 B2 | 3/2018 | Jeong |
| 10,034,399 B2 | 7/2018 | Shin et al. |
| 10,101,826 B2 | 10/2018 | Lindblad |
| 10,119,683 B2 | 11/2018 | Hirakata et al. |
| 10,367,043 B2 | 7/2019 | Yanagisawa et al. |
| 10,578,284 B2 | 3/2020 | Endo |
| 10,606,379 B2 | 3/2020 | Lindblad |
| 10,727,435 B2 | 7/2020 | Kim et al. |
| 10,736,224 B2 | 8/2020 | Park et al. |
| 10,823,374 B2 | 11/2020 | Endo |
| 11,063,094 B2 | 7/2021 | Yanagisawa et al. |
| 11,800,747 B2 | 10/2023 | Yanagisawa et al. |
| 2002/0104769 A1 | 8/2002 | Kim et al. |
| 2004/0183958 A1 | 9/2004 | Akiyama et al. |
| 2006/0244693 A1 | 11/2006 | Yamaguchi et al. |
| 2007/0097014 A1 | 5/2007 | Solomon et al. |
| 2008/0055831 A1 | 3/2008 | Satoh |
| 2009/0289877 A1 | 11/2009 | Kwon et al. |
| 2010/0066643 A1 | 3/2010 | King et al. |
| 2010/0308335 A1 | 12/2010 | Kim et al. |
| 2011/0050657 A1 | 3/2011 | Yamada |
| 2011/0286157 A1 | 11/2011 | Ma |
| 2012/0033354 A1 | 2/2012 | Huang |
| 2012/0307423 A1 | 12/2012 | Bohn et al. |
| 2013/0010405 A1 | 1/2013 | Rothkopf et al. |
| 2013/0083496 A1 | 4/2013 | Franklin et al. |
| 2013/0187839 A1 | 7/2013 | Yang et al. |
| 2013/0342090 A1 | 12/2013 | Ahn et al. |
| 2014/0028596 A1 | 1/2014 | Seo et al. |
| 2014/0065326 A1 | 3/2014 | Lee et al. |
| 2014/0111954 A1 | 4/2014 | Lee et al. |
| 2014/0159002 A1 | 6/2014 | Lee et al. |
| 2014/0159020 A1 | 6/2014 | Song et al. |
| 2014/0217382 A1 | 8/2014 | Kwon et al. |
| 2014/0217875 A1 | 8/2014 | Park et al. |
| 2014/0226275 A1 | 8/2014 | Ko et al. |
| 2014/0240985 A1 | 8/2014 | Kim et al. |
| 2014/0300529 A1 | 10/2014 | Kim et al. |
| 2014/0307396 A1 | 10/2014 | Lee |
| 2015/0016126 A1 | 1/2015 | Hirakata et al. |
| 2015/0023031 A1 | 1/2015 | Endo |
| 2015/0198978 A1 | 7/2015 | Catchpole |
| 2015/0248149 A1 | 9/2015 | Yamazaki et al. |
| 2015/0261259 A1 | 9/2015 | Endo et al. |
| 2015/0277496 A1 | 10/2015 | Reeves et al. |
| 2015/0325804 A1 | 11/2015 | Lindblad |
| 2016/0007441 A1 | 1/2016 | Matsueda |
| 2016/0118616 A1 | 4/2016 | Hiroki et al. |
| 2016/0165718 A1 | 6/2016 | Oh |
| 2016/0172623 A1 | 6/2016 | Lee |
| 2016/0273739 A1 | 9/2016 | Endo |
| 2016/0313811 A1 | 10/2016 | Lindblad |
| 2016/0358967 A1 | 12/2016 | Madurawe et al. |
| 2017/0142847 A1 | 5/2017 | Park |
| 2018/0058665 A1 | 3/2018 | Endo |
| 2018/0242466 A1* | 8/2018 | Lee .................. H05K 5/0017 |
| 2019/0018458 A1 | 1/2019 | Turchin et al. |
| 2019/0036068 A1 | 1/2019 | Kim et al. |
| 2019/0082544 A1 | 3/2019 | Park |
| 2020/0004357 A1 | 1/2020 | Harada et al. |
| 2020/0043382 A1 | 2/2020 | Isa et al. |
| 2020/0192495 A1 | 6/2020 | Lindblad |
| 2020/0321551 A1 | 10/2020 | Kim et al. |
| 2020/0365827 A1 | 11/2020 | Yamazaki et al. |
| 2021/0165454 A1* | 6/2021 | Dong .................. G06F 1/1652 |
| 2023/0350563 A1 | 11/2023 | Yamazaki et al. |
| 2023/0384879 A1 | 11/2023 | Lindblad |
| 2024/0094775 A1 | 3/2024 | Hirakata et al. |
| 2024/0255789 A1 | 8/2024 | Hirakata |
| 2024/0337366 A1 | 10/2024 | Hirakata et al. |
| 2024/0357750 A1 | 10/2024 | Hirakata et al. |
| 2024/0402860 A1 | 12/2024 | Matsumoto |

FOREIGN PATENT DOCUMENTS

| | | |
|---|---|---|
| CN | 106486517 A | 3/2017 |
| CN | 106537485 A | 3/2017 |
| CN | 107067976 A | 8/2017 |
| CN | 108369440 A | 8/2018 |
| CN | 109272872 A | 1/2019 |
| CN | 208431261 U | 1/2019 |
| CN | 109308850 A | 2/2019 |
| CN | 109872638 A | 6/2019 |
| DE | 202010008706 | 2/2011 |
| DE | 102018117701 | 1/2019 |
| EP | 1307805 A | 5/2003 |
| EP | 3136714 A | 3/2017 |
| EP | 3382497 A | 10/2018 |
| GB | 2567044 | 4/2019 |
| JP | 2004-507779 | 3/2004 |
| JP | 3164599 B | 12/2010 |
| JP | 2015-038609 A | 2/2015 |
| JP | 2015-130320 A | 7/2015 |
| JP | 2015-228022 A | 12/2015 |
| JP | 2018-189968 A | 11/2018 |
| JP | 2019-028467 A | 2/2019 |
| KR | 2002-0012881 A | 2/2002 |
| KR | 2002-0029698 A | 4/2002 |
| KR | 2002-0034664 A | 5/2002 |
| KR | 2002-0050062 A | 6/2002 |
| KR | 2015-0010640 A | 1/2015 |
| KR | 2017-0005019 A | 1/2017 |
| KR | 2017-0057500 A | 5/2017 |
| KR | 10-1834793 | 3/2018 |
| KR | 2018-0076271 A | 7/2018 |
| KR | 2018-0097195 A | 8/2018 |
| KR | 2019-0111163 A | 10/2019 |
| TW | 522775 | 3/2003 |
| TW | M395340 | 12/2010 |
| TW | 1610158 | 1/2018 |
| TW | 201911614 | 3/2019 |
| WO | WO-2002/017051 | 2/2002 |
| WO | WO-2014/057241 | 4/2014 |
| WO | WO-2015/170213 | 11/2015 |
| WO | WO-2016/012900 | 1/2016 |

OTHER PUBLICATIONS

Written Opinion (Application No. PCT/IB2020/053247) Dated Jul. 28, 2020 (8 pages).
Taiwanese Office Action (Application No. 109111111) Dated Dec. 26, 2023.

* cited by examiner

FLEXIBLE COMPONENT SUPPORT AND DISPLAY DEVICE

TECHNICAL FIELD

The present invention relates to an object, a method, or a manufacturing method. Alternatively, the present invention relates to a process, a machine, manufacture, or a composition of matter. In particular, one embodiment of the present invention relates to a semiconductor device, a light-emitting device, a display device, an electronic device, a lighting device, a driving method thereof, or a manufacturing method thereof. In particular, one embodiment of the present invention relates to a flexible component support and a display device including the flexible component support.

Note that in this specification and the like, a semiconductor device generally means a device that can function by utilizing semiconductor characteristics. A transistor, a semiconductor circuit, an arithmetic device, a memory device, and the like are each one embodiment of the semiconductor device. Moreover, a light-emitting device, a display device, a lighting device, and an electronic device each include a semiconductor device in some cases.

BACKGROUND ART

Electronic devices such as cellular phones, smartphones, tablet type computers, and laptop computers are fabricated with appropriate size depending on their functions, usability, and portability. Meanwhile, it is inconvenient to carry a plurality of electronic devices.

Accordingly, a mode in which a plurality of electronic devices can be integrated is desirable. For example, Patent Document 1 discloses a tri-fold light-emitting panel. The use of the light-emitting panel enables integration of functions of a plurality of electronic devices and manufacture of an electronic device whose size is variable.

PRIOR ART DOCUMENT

Patent Document

[Patent Document 1] Japanese Published Patent Application No. 2015-130320

SUMMARY OF THE INVENTION

Problems to be Solved by the Invention

The portability of a display panel formed over a flexible substrate can be improved when the display panel is folded. On the other hand, when the display panel is bent in a direction opposite to design intention, for example, the display panel, housings, a hinge portion for connecting the housings, or the like might be broken; therefore, the display panel is preferably well designed so as not to be easily bent in the opposite direction.

Thus, an object of one embodiment of the present invention is to provide a support for supporting a flexible component. Another object is to provide a support for performing bending operation without decreasing the reliability of a flexible component. Another object is to provide a novel flexible component support. Another object is to provide a novel light-emitting device.

Another object is to provide a folding display device with high portability. Another object is to provide a folding display device with high display visibility. Another object is to provide a folding display device having a power saving function. Another object is to provide a novel display device. Another object is to provide an operation method of a novel display device.

Note that the description of these objects does not preclude the existence of other objects. One embodiment of the present invention does not need to achieve all these objects. In addition, objects other than the above will be apparent from the description of the specification and the like, and objects other than the above can be derived from the description of the specification and the like.

Means for Solving the Problems

One embodiment of the present invention relates to a support of a flexible display panel or a tri-fold folding display device with high portability.

One embodiment of the present invention is a flexible component support that includes a first housing, a second housing, a first joint, and a second joint. The first housing and the second housing are coupled to each other through the first joint and the second joint. The first joint and the second joint have an overlap region. The first joint and the second joint each include a movable portion. The first joint includes a plurality of first columnar bodies. The plurality of first columnar bodies are coupled to each other so that first surfaces of the plurality of first columnar bodies form a continuous surface. The second joint is a hinge. The maximum opening angle of the hinge is approximately 180°.

A second columnar body including a major axis substantially perpendicular to the first surface is fixed to one of the plurality of first columnar bodies. The hinge includes a notch portion. When the opening angle of the hinge is approximately 180°, part of the second columnar body can be positioned in the notch portion.

Alternatively, one of end portions in a major axis direction of a second columnar body including a major axis substantially perpendicular to the first surface may be fixed to one of the plurality of first columnar bodies. The hinge may include a shaft that is not fixed to a blade. The other of the end portions in the major axis direction of the second columnar body may be fixed to the shaft.

In addition, another embodiment of the present invention is a flexible component support that includes a first housing, a second housing, a first joint, and a second joint. The first housing and the second housing each include a first surface and a second surface positioned opposite to the first surface. The first housing and the second housing are coupled to each other through the first joint and the second joint. The first joint and the second joint have a region where the first joint and the second joint overlap each other. The first joint and the second joint each include a movable portion. The first joint includes a plurality of first columnar bodies. A cross section perpendicular to a major axis of the first columnar body is a substantial trapezoid. The first columnar body includes a first side surface including one of legs of the substantial trapezoid, a second side surface including the other of the legs of the substantial trapezoid, and a third side surface including a lower side of the substantial trapezoid. The two adjacent first columnar bodies have a structure in which the first side surface of one of the first columnar bodies is adjacent to a second side surface of the other of the first columnar bodies and the third side surfaces of the first columnar bodies are coupled to each other to form a continuous surface. The second joint is a hinge that includes a first blade and a second blade. The maximum angle formed by the first blade and the second blade is approximately 180°. The first joint and the second joint are capable of shifting the first surfaces of the first housing and the second housing from a state where the first surfaces of the first housing and the second housing face in the same direction to a state where the first surfaces of the first housing and the second housing face each other.

A structure can be employed in which the third side surface of the first columnar body is continuous with the second surface of the first housing and the second surface of the second housing.

The number of the first columnar bodies can be an odd number. A second columnar body including a major axis substantially perpendicular to the third side surface of the first columnar body can be fixed to the first columnar body positioned in a center. Each of the first blade and the second blade can be provided with a notch portion. When the angle formed by the first blade and the second blade is approximately 180°, part of the second columnar body can be positioned in the notch portion.

Two connection parts can be provided between the first blade and the second blade, and the notch portion can be provided between the two connection parts.

Alternatively, the number of the first columnar bodies may be an odd number. One of end portions in a major axis direction of a second columnar body including a major axis substantially perpendicular to the third side surface of the first columnar body may be fixed to the first columnar body positioned in a center. The hinge may include a first shaft fixed to neither the first blade nor the second blade. The other of the end portions in the major axis direction of the second columnar body may be fixed to the first shaft.

A second shaft can be fixed to the first blade, a third shaft can be fixed to the second blade, and the first shaft can be provided between the second shaft and the third shaft.

The first blade includes a region overlapping the first surface of the first housing. The first blade and the first surface of the first housing are capable of sliding each other. The second blade includes a region overlapping the first surface of the second housing. The second blade and the first surface of the second housing are capable of sliding each other.

In addition, a structure may be employed in which the flexible component support further includes a third housing and a third joint. The third housing may include a first surface and a second surface positioned on a side opposite to that of the first surface. The second housing and the third housing may be coupled to each other through the third joint. The third joint may include a movable portion. The third joint may include a plurality of third columnar bodies. A cross section perpendicular to a major axis of the third columnar body may be a substantial rectangle. The third columnar body may include a fourth side surface including one side of the substantial rectangle, a fifth side surface facing the fourth side surface, and a sixth side surface perpendicular to the fourth side surface and the fifth side surface. The two adjacent third columnar bodies may have a structure in which the fourth side surface of one of the third columnar bodies is adjacent to the fifth side surface of the other of the third columnar bodies and the sixth side surfaces of the third columnar bodies are coupled to each other to form a continuous surface. The third joint may be capable of shifting the first surfaces of the second housing and the third housing from a state where the first surfaces of the second housing and the third housing face in the same direction to a state where the second surfaces of the second housing and the third housing face each other.

A structure can be employed in which the sixth side surface of the third columnar body is continuous with the second surface of the second housing and the second surface of the third housing.

A display device can be constructed when a flexible display panel is provided in the flexible component support.

In the flexible component support including the first to third housings, a structure can be employed in which a flexible display panel is provided over and across the second surface of the first housing to the second surface of the third housing to construct a display device.

It is preferable that the display panel include a light-emitting device.

Effect of the Invention

With the use of one embodiment of the present invention, it is possible to provide a support for supporting a flexible component. Alternatively, it is possible to provide a support for performing bending operation without decreasing the reliability of a flexible component. Alternatively, it is possible to provide a novel flexible component support. Alternatively, it is possible to provide a novel light-emitting device.

Alternatively, it is possible to provide a folding display device with high portability. Alternatively, it is possible to provide a folding display device with high display visibility. Alternatively, it is possible to provide a folding display device having a power saving function. Alternatively, it is possible to provide a folding display device that is easy to hold. Alternatively, it is possible to provide a novel display device. Alternatively, it is possible to provide an operation method of a display device.

Note that the description of these effects does not preclude the existence of other effects. Note that one embodiment of the present invention does not need to have all of these effects. Note that effects other than these will be apparent from the description of the specification, the drawings, the claims, and the like and effects other than these can be derived from the description of the specification, the drawings, the claims, and the like.

MODE FOR CARRYING OUT THE INVENTION

Figure 1A:
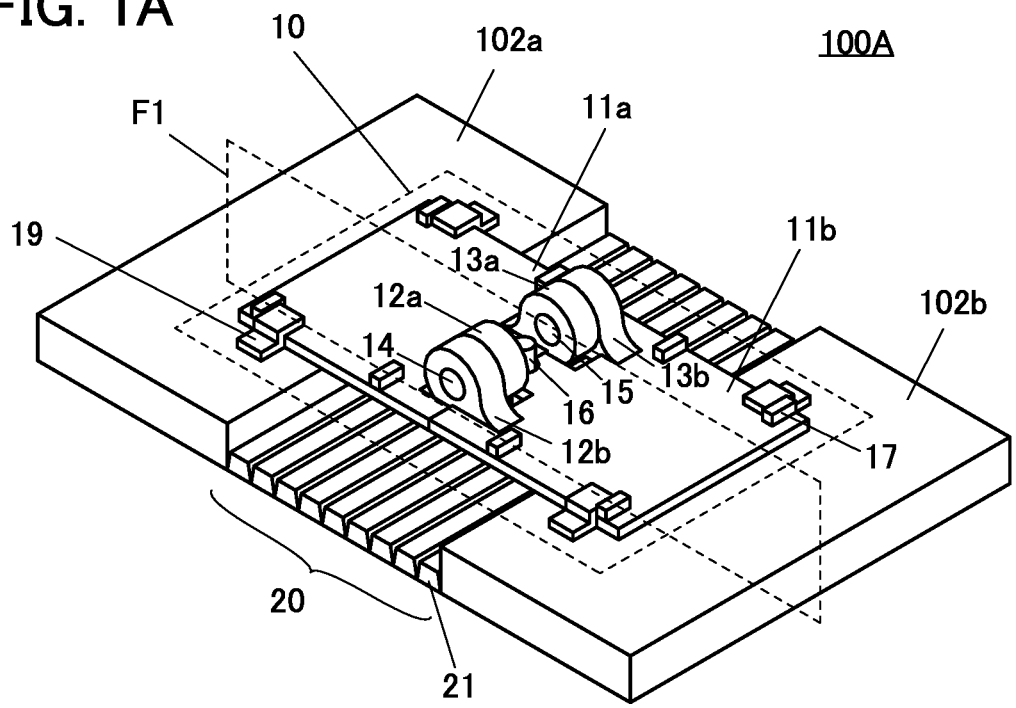
FIG. 1A and FIG. 1B are diagrams illustrating a support.

Embodiments will be described in detail with reference to the drawings. Note that the present invention is not limited to the following description, and it will be readily understood by those skilled in the art that modes and details of the present invention can be modified in various ways without departing from the spirit and scope of the present invention. Therefore, the present invention should not be construed as being limited to the description of embodiments below. Note that in structures of the invention described below, the same reference numerals are used in common, in different drawings, for the same portions or portions having similar functions, and a repeated description thereof is omitted in some cases. Note that the hatching of the same component that constitutes a drawing is sometimes omitted or changed as appropriate in different drawings.

In addition, even in the case where a single component is illustrated in a circuit diagram, the component may be composed of a plurality of parts as long as there is no functional inconvenience. For example, in some cases, a plurality of transistors that operate as a switch are connected in series or in parallel. Furthermore, in some cases, capacitors are divided and arranged in a plurality of positions.

In addition, one conductor has a plurality of functions such as a wiring, an electrode, and a terminal in some cases. In this specification, a plurality of names are used for the same component in some cases. Furthermore, even in the case where elements are illustrated in a circuit diagram as if they were directly connected to each other, the elements may actually be connected to each other through one conductor or a plurality of conductors. In this specification, even such a structure is included in the category of direct connection.

Embodiment 1

In this embodiment, a flexible component support and a display device according to one embodiment of the present invention are described with reference to drawings. Note that in this specification, a display panel is typically treated as a flexible component; however, the flexible component may be another component. Examples of the flexible component include a solar battery, a primary battery, a secondary battery, an antenna, a speaker, a microphone, a cable, illumination, a variety of terminals, a variety of sensors, a variety of circuits, a composite device including any of these, and the like.

In addition, in this specification, a display device generally means a device that has a display function. In other words, an electronic device including a display portion is included in a display device. For example, an electronic device including a display portion, such as a cellular phone, a smartphone, a smartwatch, a tablet type computer, or a television, is included in a display device.

One embodiment of the present invention is a flexible component support capable of folding a flexible component. The support has a region where bending operation can be performed only in one direction from a flat surface state. Accordingly, even in the case where unintended bending stress is applied to the region in an opposite direction, the flexible component or the support can be protected.

In addition, another embodiment of the present invention is a foldable display device including a flexible display panel. The display device has tri-fold mechanism, and a region where folding is performed so that first surfaces of the display device face each other and a region where folding is performed so that surfaces opposite to the first surfaces face each other can be formed. Accordingly, even a display panel with a comparatively high aspect ratio of a display surface, for example, 16:9, 18:9, or 21:9 can be folded small when a crease is provided in a minor axis direction, which results in improved portability. Furthermore, a display region that cannot be seen when being folded is made to display no images, so that power consumption can be significantly reduced.

<Flexible Component Support 1>

Figure 1B:
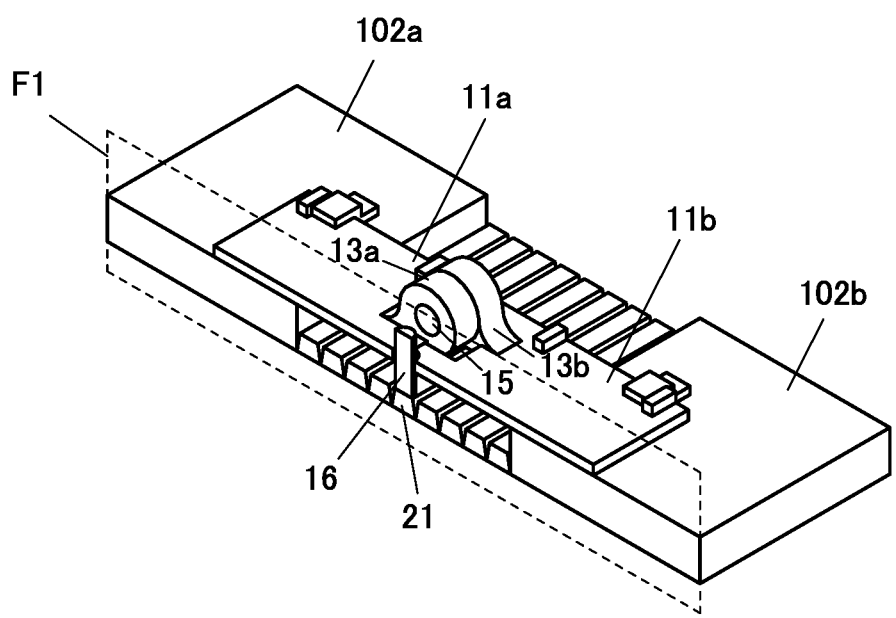
Figure 4A:
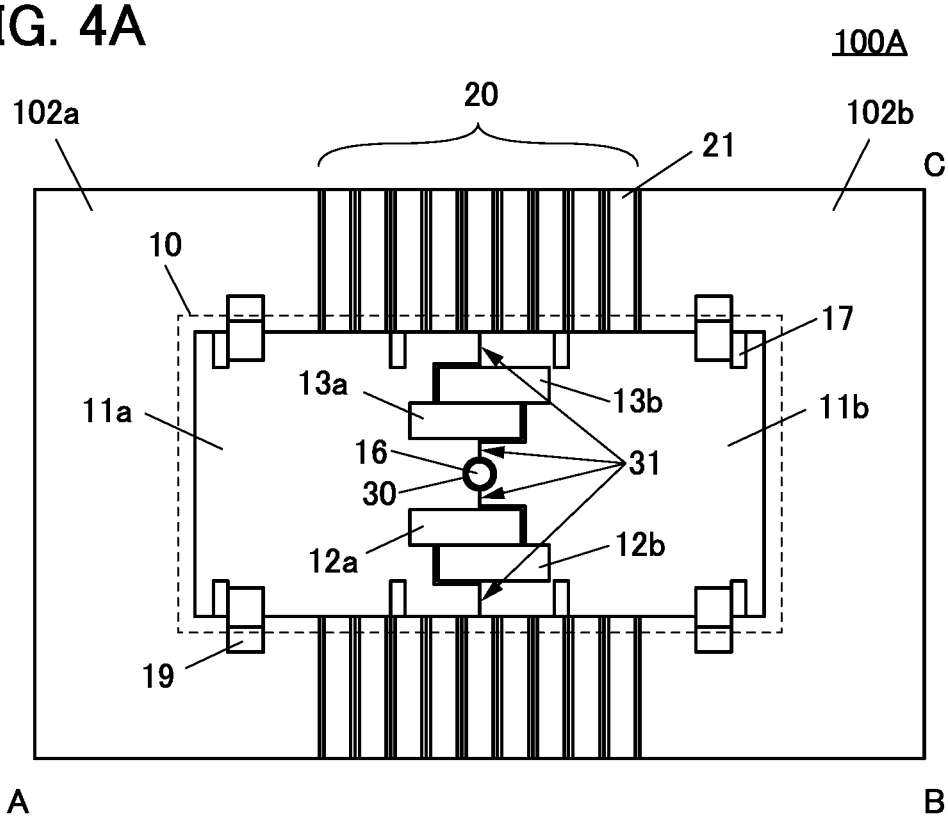
FIG. 4A to FIG. 4C are diagrams illustrating the support.
Figure 4B:
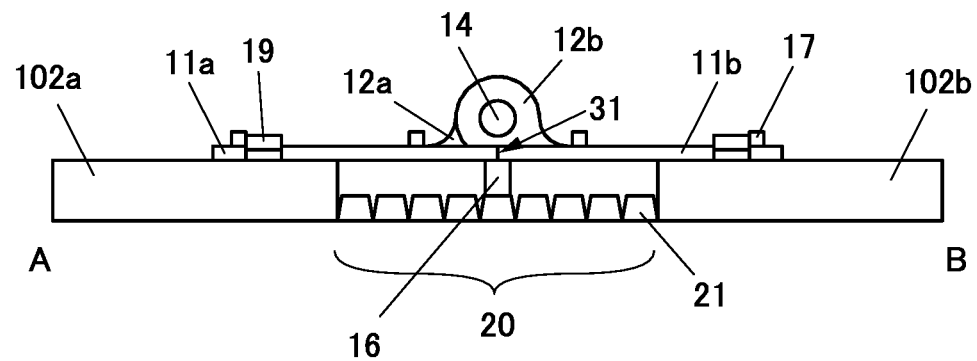
Figure 4C:
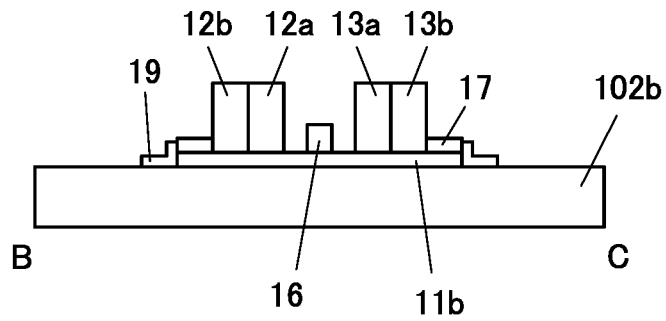

FIG. 1A is a diagram illustrating a state where a flexible component support 100A according to one embodiment of the present invention is unfolded. FIG. 1B is a diagram illustrating a cross section cut along a surface F1 perpendicular to the support 100A. In addition, a plane view, a front view, and a side view that correspond to the state in FIG. 1A are illustrated in FIG. 4A, FIG. 4B, and FIG. 4C, respectively.

The support 100A includes a housing 102a, a housing 102b, a hinge 10, and a hinge 20. The hinge 10 and the hinge 20 have a region where the hinge 10 and the hinge 20 overlap each other in the same movable direction.

Note that a housing refers to a box-like member whose inside or surface can be provided with a component or the like. In the case where a component is provided for only a surface of a housing, the housing may be a plate-like member. Alternatively, the entire part including a hinge is sometimes referred to as a housing. In addition, a hinge refers to a joint including a movable portion and is a component that controls the relative position of two members coupled to each other. Furthermore, a housing and a hinge are sometimes formed continuously using the same member.

A housing in this embodiment is a substantially rectangular solid that includes a first surface, a second surface opposite to the first surface, and other surfaces. In addition, although the first surface and the second surface are illustrated as flat surfaces in this embodiment, the first surface and the second surface may include curved surfaces. Furthermore, the surface may be provided with step height or the like, as needed. Alternatively, a corner of a rectangular solid may be rounded. Moreover, one of the first surface and the second surface can be referred to as an upper surface, and the other of the first surface and the second surface can be referred to as a lower surface, for example.

The hinge 10 has a hinge structure and includes a blade 11a, a blade 11b, a shaft 12a, a shaft 13a, a shaft 12b, a shaft 13b, a spindle 14, a spindle 15, and a plurality of stoppers 17.

The shaft 12a and the shaft 13a are fixed to the blade 11a. The shaft 12b and the shaft 13b are fixed to the blade 11b. The spindle 14 is inserted into the shaft 12a and the shaft 12b so that a first connection part is formed. The spindle 15 is inserted into the shaft 13a and the shaft 13b so that a second connection part is formed. With the above structure, the blade 11a and the blade 11b can move with the first and second connection parts used as rotation axes (fulcrums).

Note that the shaft 12a and the shaft 13a may be parts of the blade 11a. In addition, the shaft 12b and the shaft 13b may be parts of the blade 11b.

In addition, a notch portion 30 is provided for the blade 11a and the blade 11b between the first connection part and the second connection part (see FIG. 4A). The notch portion 30 is used for position correction together with a pin 16 to be described later.

The blade 11a has a region overlapping a first surface of the housing 102a. In addition, the blade 11a has a region overlapping part of a jig 19 fixed to the housing 102a. Gaps are provided between the blade 11a and the housing 102a and between the blade 11a and the jig 19. Accordingly, the blade 11a and the first surface of the housing 102a can slide over each other.

The blade 11b has a region overlapping a first surface of the housing 102b. In addition, the blade 11b has a region overlapping part of the jig 19 fixed to the housing 102b. Gaps are provided between the blade 11b and the housing 102b and between the blade 11b and the jig 19. Accordingly, the blade 11b and the first surface of the housing 102b can slide over each other.

Note that the stoppers 17 are provided over the blade 11a and the blade 11b, and contact of the jigs 19 with the stoppers 17 can limit the slide amount. In addition, providing the stoppers 17 can prevent separation of the hinge 10.

Figure 5A:
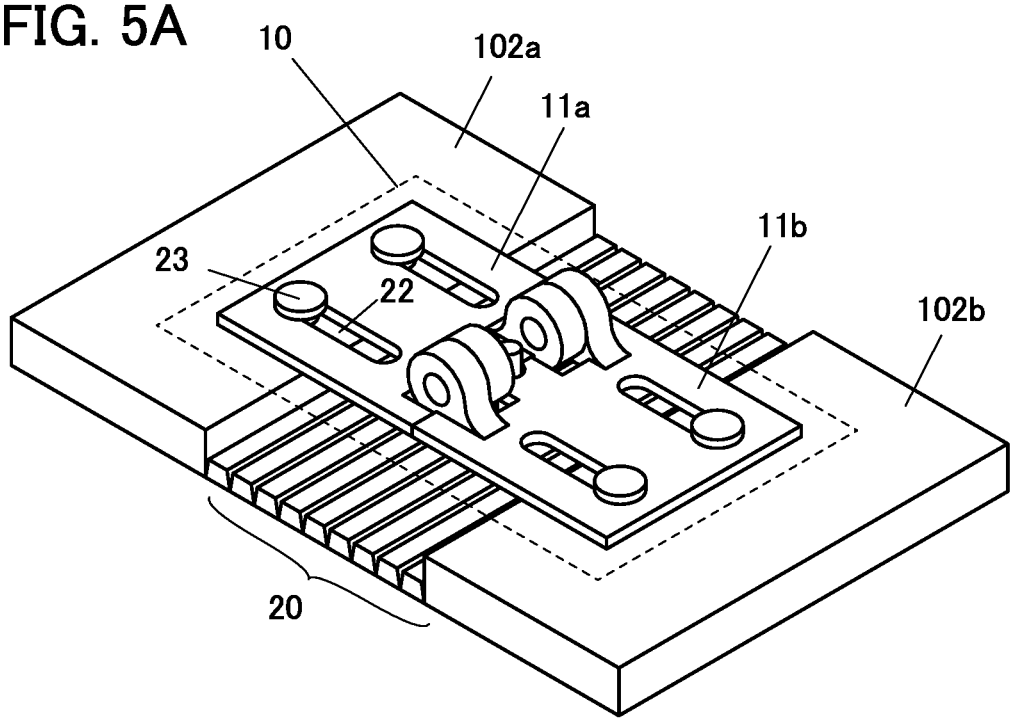
FIG. 5A and FIG. 5B are diagrams illustrating a support.

Note that slide mechanism may be constructed with a structure different from that in FIG. 1A. For example, as illustrated in FIG. 5A, a structure may be employed in which slotted holes 22 are provided in the blade 11a and stoppers 23 are provided through the slotted holes 22.

The stopper 23 includes a small axis whose diameter is smaller than a minor axis of the slotted hole 22 and a top part whose diameter is larger than the minor axis of the slotted hole 22. The axis is fixed to the housing 102a through the slotted hole 22. Gaps are provided between the housing 102a and the blade 11a and between the blade 11a and the top part of the stopper 23. Accordingly, the blade 11a and the first surface of the housing 102a can slide over each other. A blade 11b side can also have a similar structure. Moreover, slide mechanism using a rail or a bearing may be employed.

As illustrated in FIG. 4A, a region 31 where an end surface of the blade 11a is in contact with an end surface of the blade 11b is generated in the hinge 10 in an unfolded state. Here, when an angle formed by a top surface (a side on which a spindle is provided) of each blade and the end surface is approximately 90°, the maximum opening angle (angle formed by the blade 11a and the blade 11b) of the hinge 10 can be approximately 180°. Accordingly, the hinge 10 is compatible with bending in one direction but is not compatible with bending in an opposite direction. In other words, even when the hinge 20 is compatible with bending in the opposite direction, the hinge 10 can inhibit bending in the opposite direction; therefore, even when bending stress is applied to the flexible component or the support in the opposite direction, the flexible component or the support can be protected.

Figure 5B:
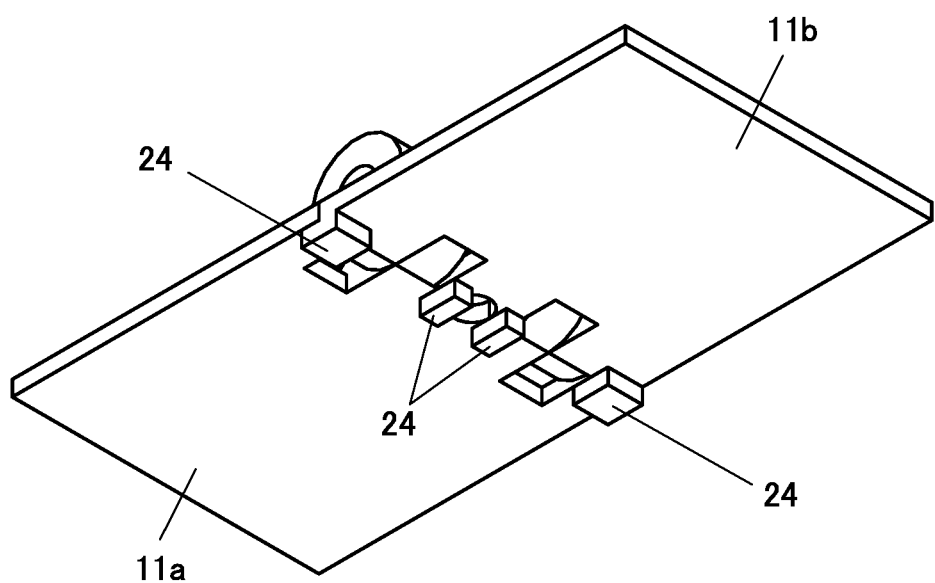

Alternatively, as illustrated in FIG. 5B, a backing plate 24 for preventing reverse bending may be provided on a blade lower surface. When the backing plate 24 that is fixed to one of the blades is in contact with the other of the blades, further bending cannot be performed. Accordingly, the backing plate 24 is made in contact with the blade when the angle formed by the blade 11a and the blade 11b is approximately 180°, so that the maximum opening angle of the hinge 10 can be controlled so as to be approximately 180°.

In that case, the angle formed by the top surface and the end surface of the blade does not necessarily have adequate accuracy. Note that although FIG. 5B illustrates an example where the backing plate 24 is fixed to the blade 11b, the backing plate 24 may be fixed to the blade 11a. In addition, the backing plate 24 may be part of the blade 11a (the blade 11b).

The hinge 20 includes a plurality of columnar bodies 21 each with a cross section perpendicular to a major axis used as a trapezoid or a substantial trapezoid. The columnar body 21 includes a first side surface (a surface including one of legs of the trapezoid or the substantial trapezoid) and a second side surface (a surface including the other of the legs of the trapezoid or the substantial trapezoid). Two adjacent columnar bodies 21 have a structure where the first side surface of one of the columnar bodies 21 is adjacent to the second side surface of the other of the columnar bodies 21. Some of the two adjacent columnar bodies 21 are directly connected to each other or connected to each other through another member, and their relative positions can be changed.

The columnar bodies 21 are coupled to each other such that third side surfaces (surfaces each including a lower base of the trapezoid or the substantial trapezoid) form a continuous surface. In addition, the third side surface of the columnar body 21 in one of end portions of the hinge 20 is connected to the second surface of the housing 102a so as to be continuous with the second surface of the housing 102a. Furthermore, the third side surface of the columnar body 21 in the other of the end portions of the hinge 20 is connected to the second surface of the housing 102b so as to be continuous with the second surface of the housing 102b. Note that the shape of a fourth side surface (a surface including an upper base of the trapezoid or the substantial trapezoid) of each of the columnar bodies 21 may be any shape as long as no interference occurs in the other columnar body 21, the hinge 10, and the housings 102a and 102b. Accordingly, the cross section perpendicular to the major axis of the columnar body 21 may be a triangle or a substantial triangle.

Note that a substantial trapezoid refers to a shape that can be substantially regarded as a trapezoid. For example, examples of the substantial trapezoid include a shape that includes curves in some sides of a trapezoid, a shape in which a trapezoid corner is rounded, and the like. The same applies to a substantial triangle.

The number of the columnar bodies 21 included in the hinge 20 is an odd number. The pin 16 is fixed to the columnar body 21 positioned in the center, and a major axis of the pin 16 and the third side surface of the columnar body 21 form a substantially perpendicular angle. The pin 16 is a columnar body, and part of the pin 16 is positioned in the notch portion 30 when the support 100A is in an unfolded state, as illustrated in FIG. 1B. Note that the shape of a cross section perpendicular to the major axis of the pin 16 is a circle, for example. In that case, a top surface shape of the notch portion 30 included in one blade of the hinge 10 is preferably a semicircle that is larger than a curvature radius of the pin 16.

Figure 2A:
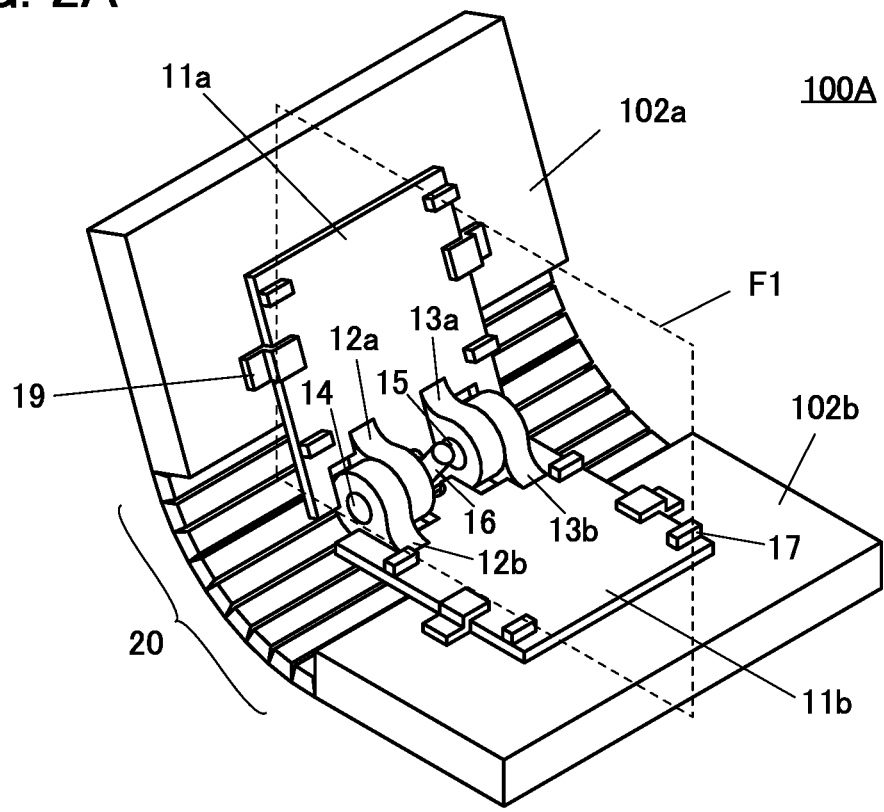
FIG. 2A and FIG. 2B are diagrams illustrating the support.

FIG. 2A is a diagram illustrating a state where bending operation is added to the support 100A. In addition, FIG. 2B is a diagram illustrating a cross section cut along the surface F1 perpendicular to the support 100A.

Figure 2B:
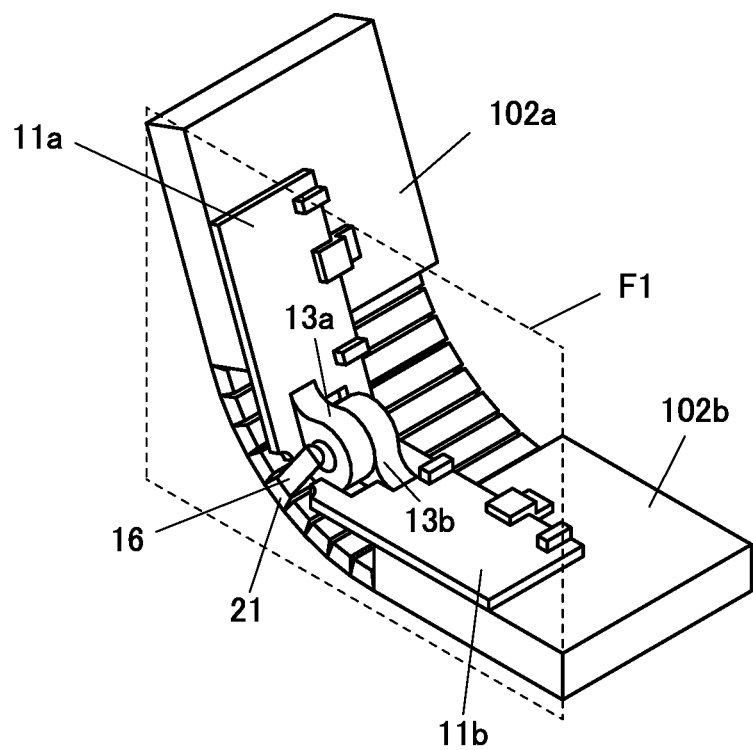

As illustrated in FIG. 2A and FIG. 2B, when bending operation is added to the support 100A, the first side surface of the one of the two adjacent columnar bodies 21 and the second side surface of the other of the columnar bodies 21 in the hinge 20 are transformed to be close to each other. In that case, the third side surfaces of the two adjacent columnar bodies 21 are continuous with each other to form a certain angle, and a region where the entire cross section is substantially arc-shaped is formed. Accordingly, when the flexible component is provided to overlap the region, the component can form a curved surface in a portion overlapping the region.

When the cross section of the hinge 20 is transformed to be arc-shaped, the length of an inner arc in the hinge 20 is smaller than the length of an outer arc. Accordingly, the blade 11a of the hinge 10 positioned inside the hinge 20 slides to offset the change. The same applies to the blade 11b.

The hinge 10, and the housing 102a and the housing 102b form simple slide mechanism. Thus, one of the blade 11a and the blade 11b sometimes slides more widely than the other of the blade 11a and the blade 11b. When the one of the blade 11a and the blade 11b slides too widely, troubles such as deviation of a bending center position and inability of bending operation afterwards sometimes occur.

In one embodiment of the present invention, an end portion of the notch portion 30 in the one of the blades that slides widely is in contact with the pin 16 so that slide operation is forcibly stopped and slide operation of the other of the blades is promoted. Accordingly, a rotation axis of the hinge 10 can be corrected to be positioned around the center of the hinge 20, and stable bending operation can be performed.

Figure 3A:
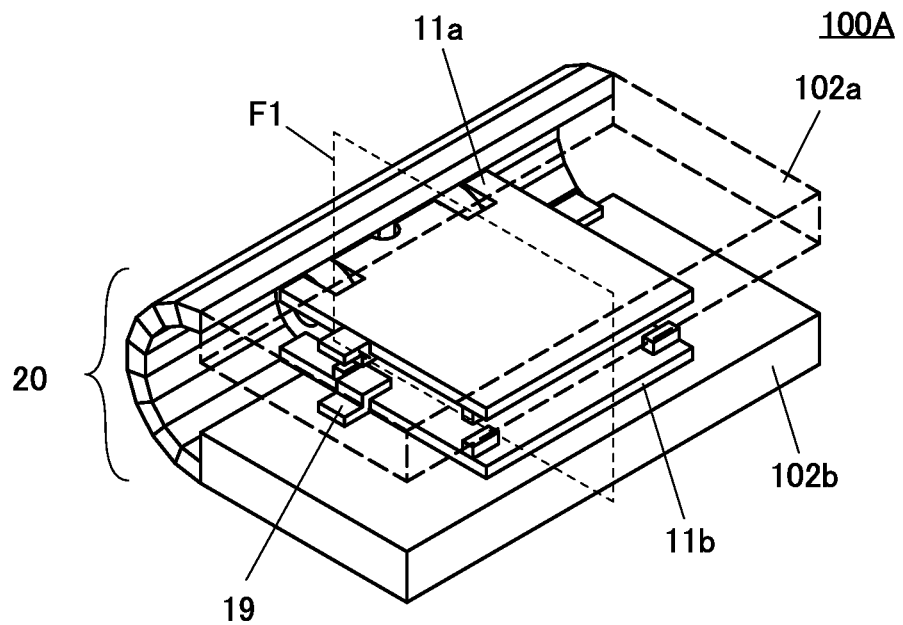
FIG. 3A and FIG. 3B are diagrams illustrating the support.
Figure 3B:
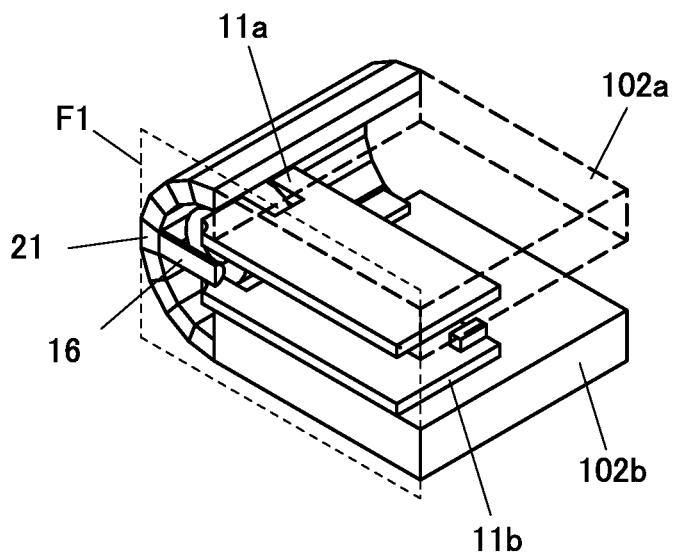

FIG. 3A is a diagram illustrating a folded state where bending operation is further added to the support 100A. In addition, FIG. 3B is a diagram illustrating a cross section cut along the surface F1 perpendicular to the support 100A. Note that in FIG. 3A and FIG. 3B, the housing 102a is illustrated by a dashed line for clarity.

As illustrated in FIG. 3B, even when the support 100A is in a completely folded state, neither the hinge 10 nor the hinge 20 interferes with the pin 16.

In addition, also in the course of changing the support 100A from the folded state illustrated in FIG. 3A to the unfolded state illustrated in FIG. 1A through the state in FIG. 2A, the one of the blade 11a and the blade 11b in the hinge 10 sometimes slides more widely than the other of the blade 11a and the blade 11b in the hinge 10.

As in the above, the end portion of the notch portion 30 in the one of the blades that slides widely is in contact with the pin 16 so that slide operation is forcibly stopped and slide operation of the other of the blades is promoted also in this case. Accordingly, the rotation axis of the hinge 10 can be corrected to be positioned around the center of the hinge 20, and stable unfold operation can be performed.

Note that although the above description is made under a concept that the position of the hinge 10 is corrected with respect to the operation of the hinge 20, it can also be said that the position of the hinge 20 is relatively corrected with respect to the operation of the hinge 10. Alternatively, it can also be said that the hinge 10 and the hinge 20 also correct their positions each other.

Figure 6A:
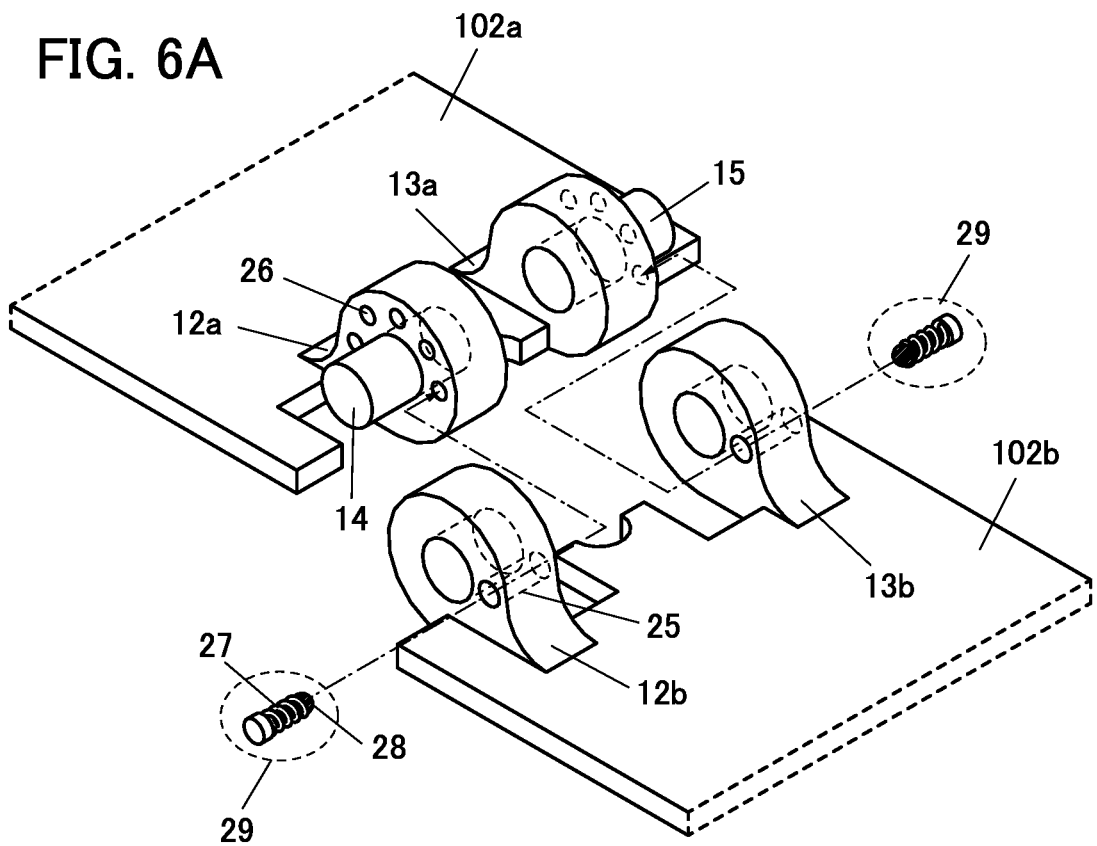
FIG. 6A to FIG. 6C are diagrams illustrating notch mechanism.

In addition, as illustrated in FIG. 6A, the hinge 10 may be provided with notch mechanism. The notch mechanism can include a lock part 29 including a ball 28 on a tip of a spring 27, a hole portion 25 provided in the shaft 12b, and hollow portions 26 provided in the shaft 12a. Note that although the notch mechanism provided for the shaft 12a and the shaft 12b is described here, similar notch mechanism may be provided for the shaft 13a and the shaft 13b.

Figure 6B:
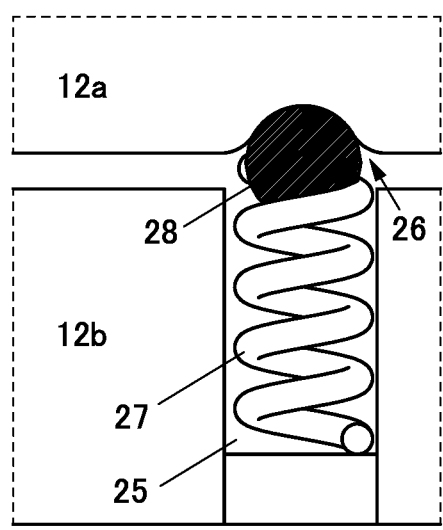

When a state is set in which the lock part 29 is inserted into the hole portion 25 and the shaft 12a and the shaft 12b are combined with each other, as illustrated in an inside view of FIG. 6B, the ball 28 enters the hollow portion 26 due to elasticity of the spring 27 and is simply locked. When bending operation is performed with equal to or more than a certain amount of force, the ball 28 is unlocked and the blade is moved, and the ball 28 enters another hollow portion 26 and is simply locked again.

For example, in the case where five hollow portions 26 are provided at intervals of 45° starting from 180° with the spindle 14 as the center, the ball 28 can be simply locked when an angle formed by the two blades is 180°, 135°, 90°, 45°, or 0°. When the ball 28 is locked at an appropriate angle, unintended transformation when using or carrying can be prevented. Alternatively, user's convenience can be improved when using at the same angle every time, for example.

Note that in the hollow portion 26 with a shallow shape as illustrated in FIG. 6B, the ball 28 is unlocked comparatively easily, which enables rotation in both directions for increasing and decreasing the angle. In contrast, in the hollow portion 26 with a deep asymmetrical shape as illustrated in FIG. 6C, rotation in a direction for increasing the angle can be inhibited, for example.

Figure 6C:
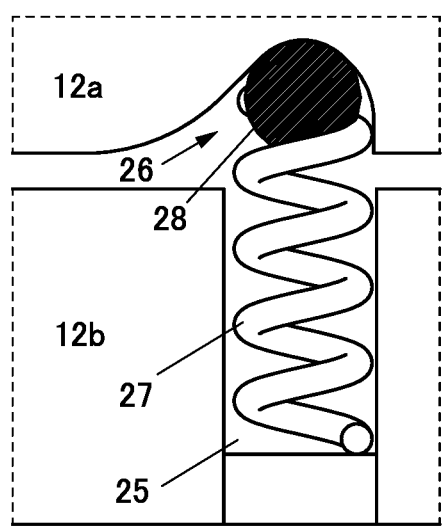

A slope is formed in one region of the hollow portion 26 illustrated in FIG. 6C, and the ball 28 can therefore move. However, there is no slope in a region opposite to the one region, and the ball 28 cannot move. Accordingly, for example, when the hollow portion 26 in FIG. 6C is used as the hollow portion 26 in which the angle formed by the two blades is approximately 180°, the maximum angle formed by the blade 11a and the blade 11b can be controlled so as to be approximately 180°.

<Flexible Component Support 2>

Figure 7A:
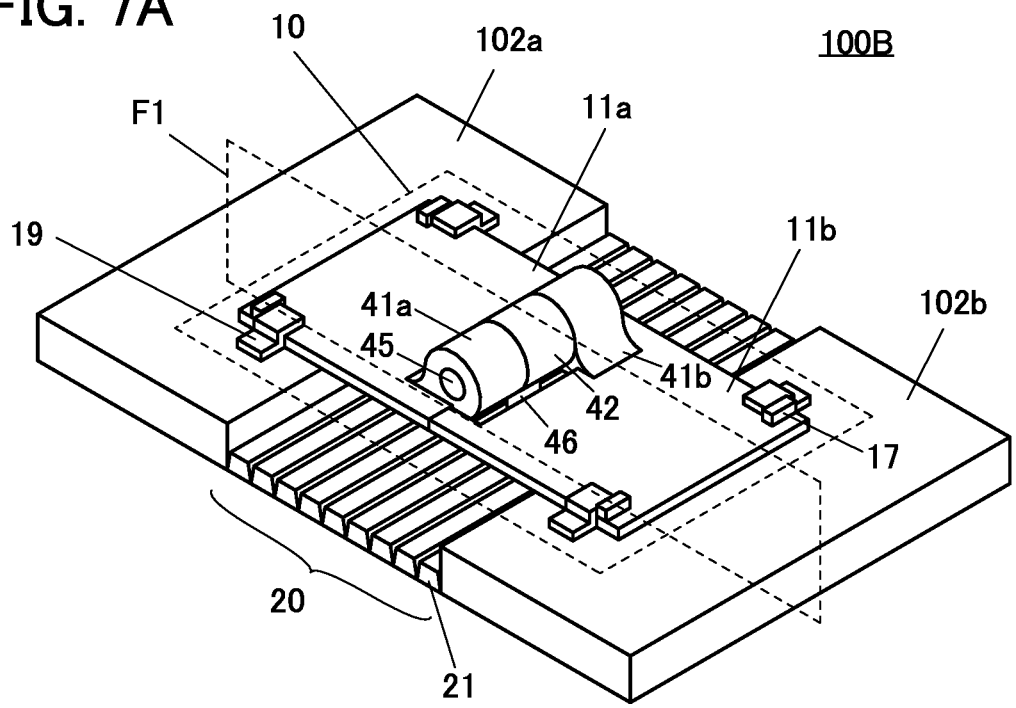
FIG. 7A and FIG. 7B are diagrams illustrating a support.
Figure 7B:
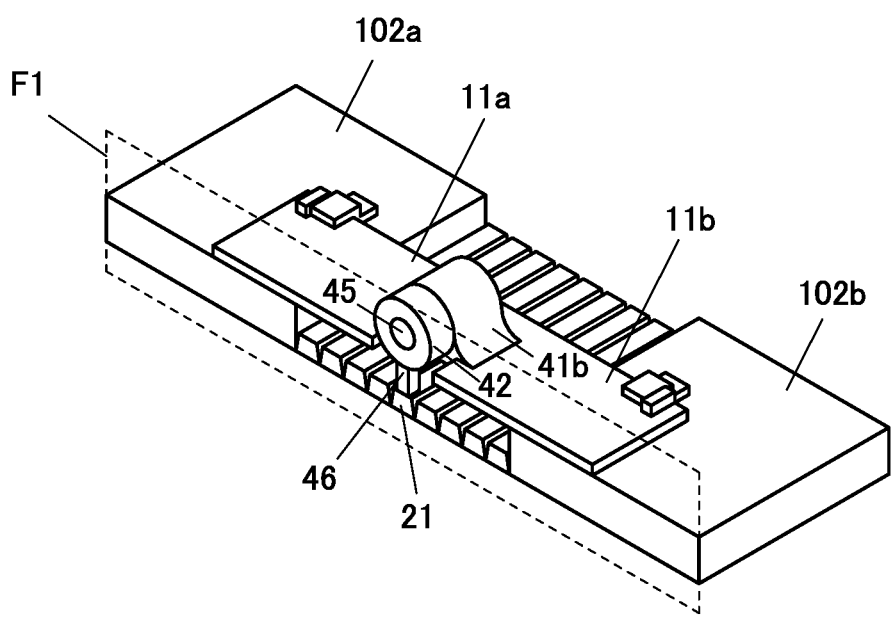
Figure 10A:
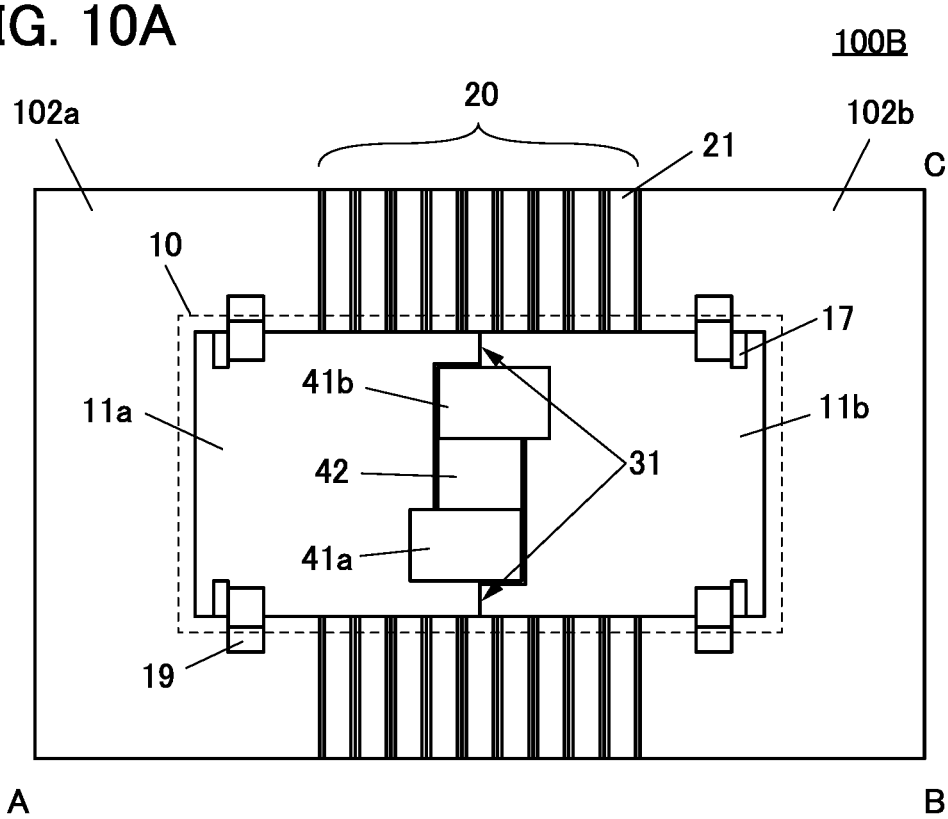
FIG. 10A to FIG. 10C are diagrams illustrating the support.
Figure 10B:
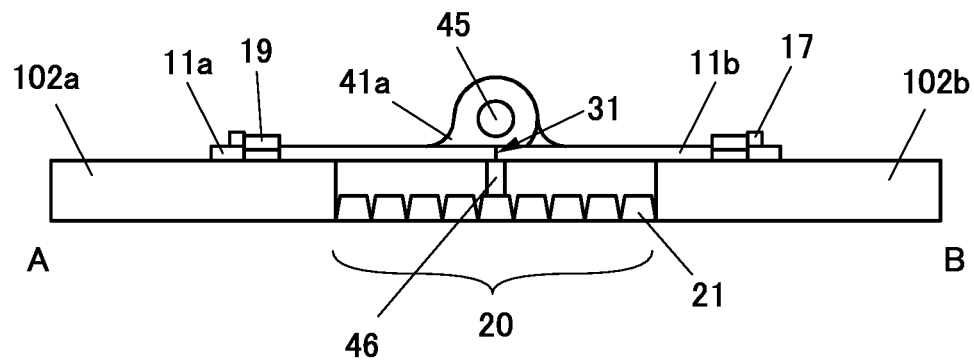
Figure 10C:
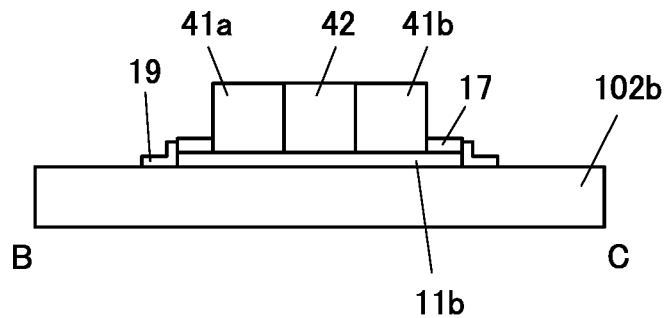

FIG. 7A is a diagram illustrating a state where a support 100B that is different from the support 100A is unfolded. The structure of the hinge 10 in the support 100B is different from that in the support 100A. FIG. 7B is a diagram illustrating a cross section cut along the surface F1 perpendicular to the support 100B is a cut surface. In addition, a plane view, a front view, and a side view that correspond to the state in FIG. 7A are illustrated in FIG. 10A, FIG. 10B, and FIG. 10C, respectively.

In the following description, the hinge 10 included in the support 100B is mainly described, and a description of the housings 102a and 102b and the hinge 20 that are common to the support 100A and a description of a slide between a blade of the hinge 10 and a housing are omitted. In addition, components common to the support 100A are denoted by the same reference numerals.

The hinge 10 included in the support 100B has a hinge structure and includes the blade 11a, the blade 11b, a shaft 41a, a shaft 41b, a shaft 42, a spindle 45, and the plurality of stoppers 17.

The shaft 41a is fixed to the blade 11a. The shaft 41b is fixed to the blade 11b. The shaft 42 is fixed to neither the blades 11a nor 11b. The shaft 42 is provided between the shaft 41a and the shaft 41b, and the spindle 45 is inserted into the shaft 41a, the shaft 42, and the shaft 41b so that a connection part is formed. With the above structure, the blade 11a and the blade 11b can move with the connection part used as a rotation axis (fulcrum).

Note that the shaft 41a may be part of the blade 11a. In addition, the shaft 41b may be part of the blade 11b. A pin 46 is fixed to the shaft 42, and the pin 46 is fixed to one of the columnar bodies 21 included in the hinge 20.

As illustrated in FIG. 10A and FIG. 10B, the region 31 where the end surface of the blade 11a is in contact with the end surface of the blade 11b is generated in the hinge 10 in an unfolded state. Accordingly, like the hinge 10 included in the support 100A, the maximum opening angle of the hinge 10 can be approximately 180°, and bending in an opposite direction can be inhibited.

Like the support 100A, the number of the columnar bodies 21 included in the hinge 20 is an odd number, and one of end portions in a major axis direction of the pin 46 where the third side surface of the columnar body 21 and the major axis form a substantially perpendicular angle is fixed to the columnar body 21 positioned in the center, as illustrated in FIG. 7B and FIG. 10B, for example. The pin 46 is a columnar body, and the other of the end portions in the major axis direction of the pin 46 is fixed to the shaft 42. Note that the number of the pins 46 is not limited to one and may be plural. In addition, the shape of a cross section perpendicular to the major axis of the pin 46 is not particularly limited.

Figure 8A:
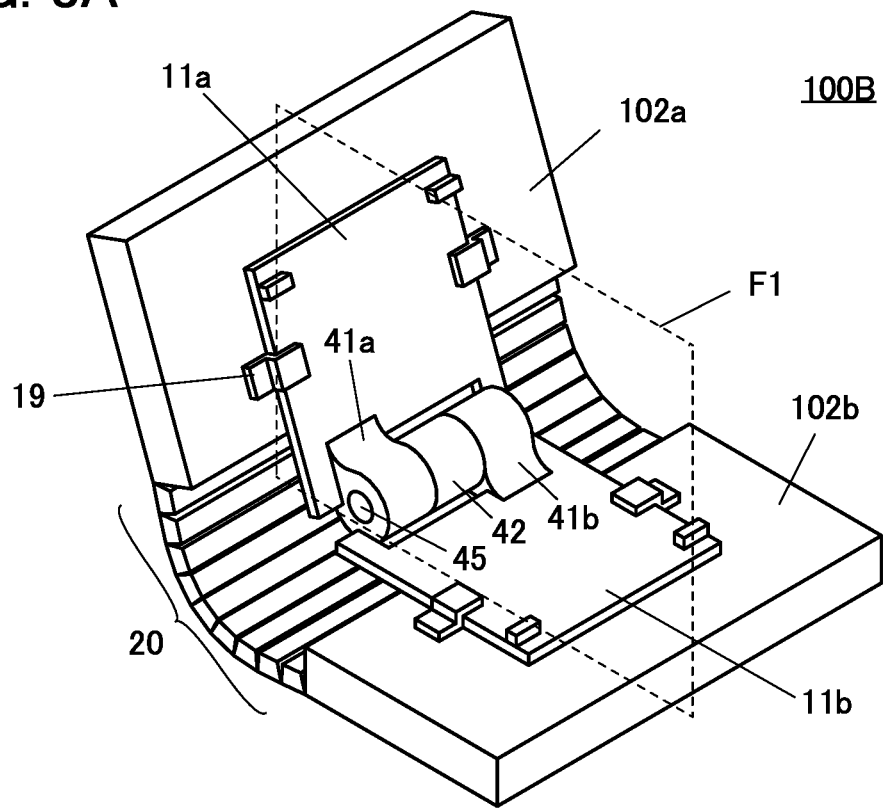
FIG. 8A and FIG. 8B are diagrams illustrating the support.

FIG. 8A is a diagram illustrating a state where bending operation is added to the support 100B. In addition, FIG. 8B is a diagram illustrating a cross section cut along the surface F1 perpendicular to the support 100B.

Figure 8B:
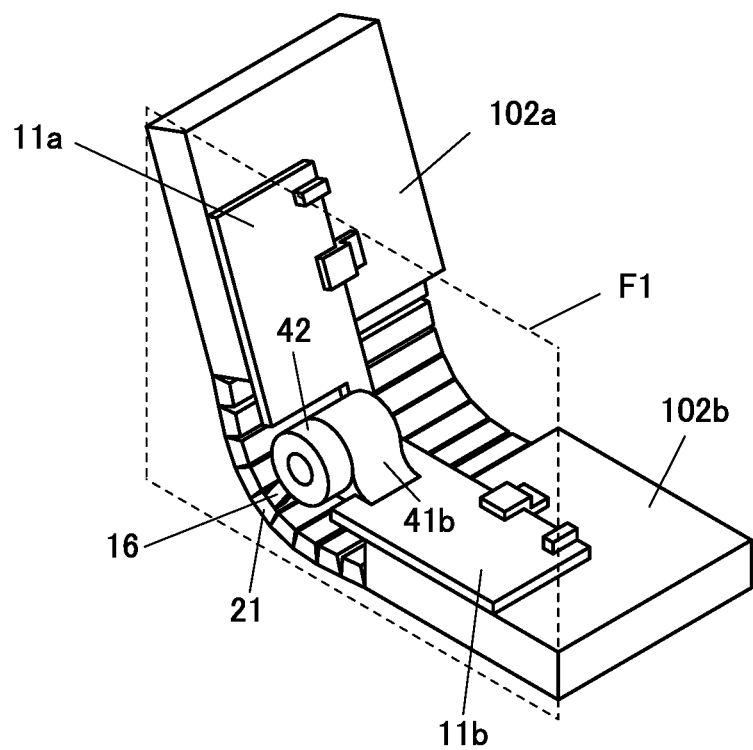

As illustrated in FIG. 8A and FIG. 8B, when bending operation is added to the support 100B, the third side surfaces of the columnar bodies 21 included in the hinge 20 are continuous with each other to form a certain angle; thus, a substantially arc-shaped region is formed in a cross section of the entire hinge 20. In that case, the length of an inner arc in the hinge 20 is smaller than the length of an outer arc. Accordingly, the blade 11a of the hinge 10 positioned inside the hinge 20 slides to offset the change. The same applies to the blade 11b.

In the support 100B, the shaft 42 that is positioned in the center of the rotation axis (connection part) of the hinge 10 is fixed to the columnar body 21 that is positioned in the center of the hinge 20 through the pin 46; thus, the rotation axis of the hinge 10 and a central part of the hinge 20 operate so as to always overlap each other. Accordingly, one of the blade 11a and the blade 11b does not slide more widely than the other of the blade 11a and the blade 11b, so that stable bending operation can be performed.

Figure 9A:
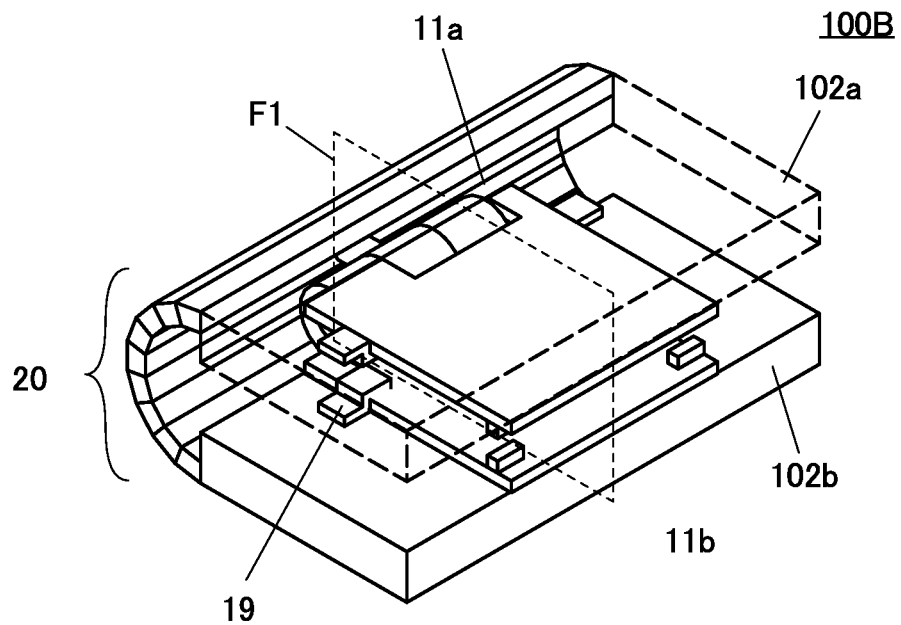
FIG. 9A and FIG. 9B are diagrams illustrating the support.
Figure 9B:
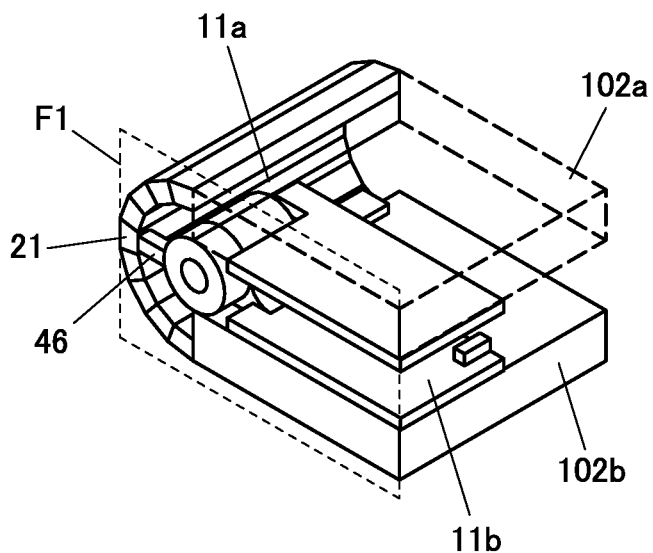

FIG. 9A is a diagram illustrating a folded state where bending operation is further added to the support 100B. In addition, FIG. 9B is a diagram illustrating a cross section cut along the surface F1 perpendicular to the support 100B. Note that in FIG. 9A and FIG. 9B, the housing 102a is illustrated by a dashed line for clarity.

Also in the course of changing the support 100B from the folded state illustrated in FIG. 9A to the unfolded state illustrated in FIG. 7A through the state in FIG. 8A, stable unfold operation can be performed because the rotation axis of the hinge 10 and the central part of the hinge 20 operate so as to always overlap each other.

Note that the structures of the slotted hole 22 of the hinge 10 and the stopper 23 that are illustrated in FIG. 5A can also be employed in the support 100B. In addition, the structure of the backing plate 24 illustrated in FIG. 5B can also be employed. Furthermore, the structure of the notch mechanism illustrated in FIG. 6A and FIG. 6B can also be employed.

<Display Device>

The support 100A or the support 100B that is provided with a flexible display panel can be employed in a display device.

Figure 11A:
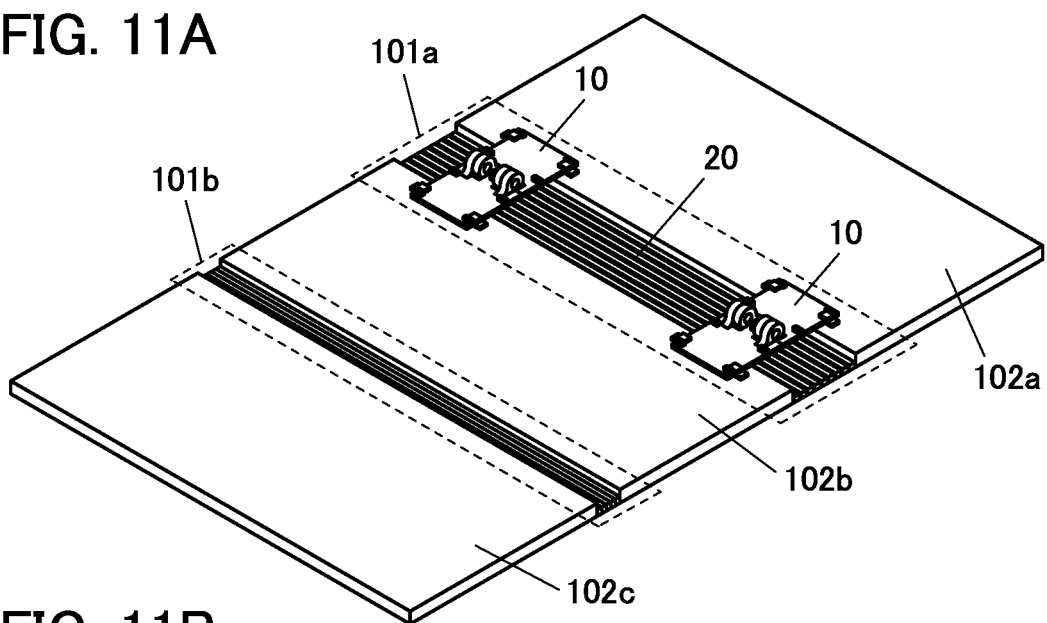
FIG. 11A to FIG. 11C are diagrams illustrating a display device.
Figure 11B:
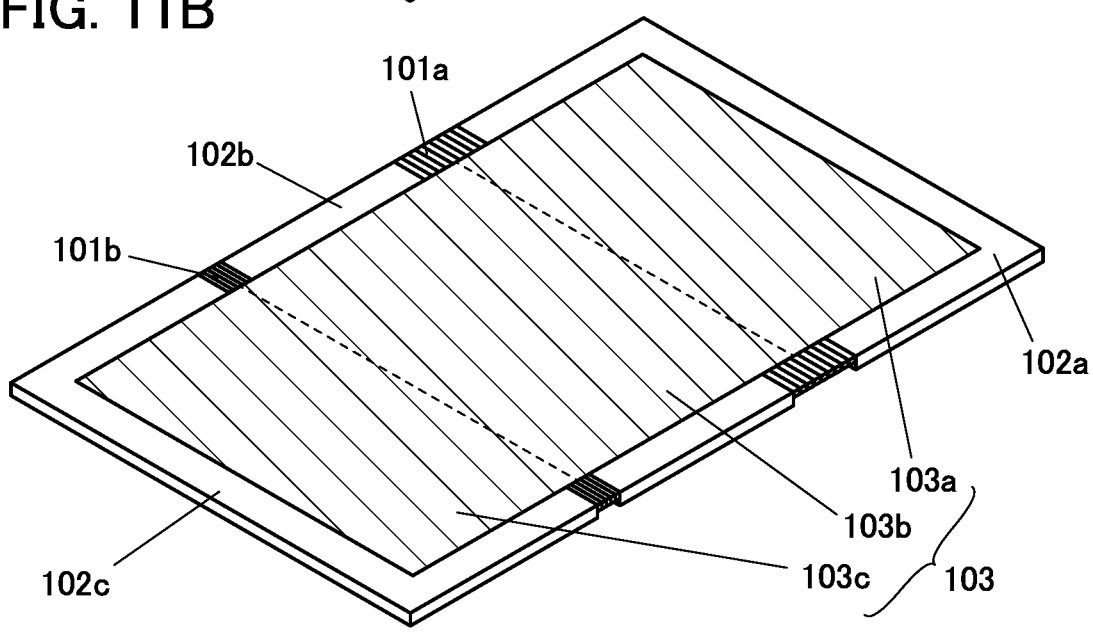
Figure 11C:
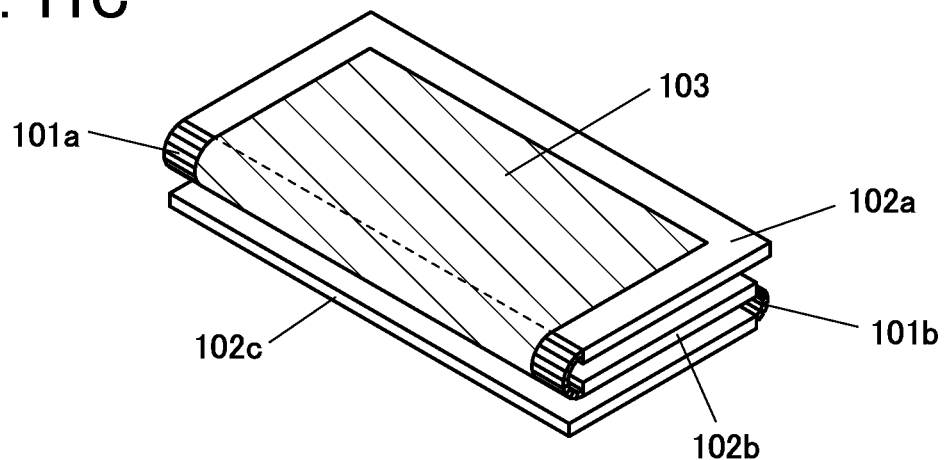

FIG. 11A to FIG. 11C are diagrams illustrating a tri-fold display device. Note that a combination of the hinge 10 and the hinge 20 that are included in the support 100A is described here as a hinge portion 101a. The hinge portion 101a is provided between the housing 102a and the housing 102b. A hinge portion 101b is provided between the housing 102b and a housing 102c. Here, like the other housings, the housing 102c is a substantially rectangular solid with a structure including a first surface and a second surface. A flexible display panel 103 can be provided over the second surfaces of the housings 102a to 102c that are opposite to the first surfaces of the housings 102a to 102c.

FIG. 11A is a perspective view on the first surface sides of the housings 102a to 102c with a display device in an unfolded state. Although a structure where two hinges 10 are provided for the hinge portion 101a is illustrated, one hinge 10 may be provided as in FIG. 1A and the like. Alternatively, three or more hinges 10 may be provided. The number of the hinges 10 may be determined in consideration of the housing width so that stable bending operation can be performed.

Figure 12A:
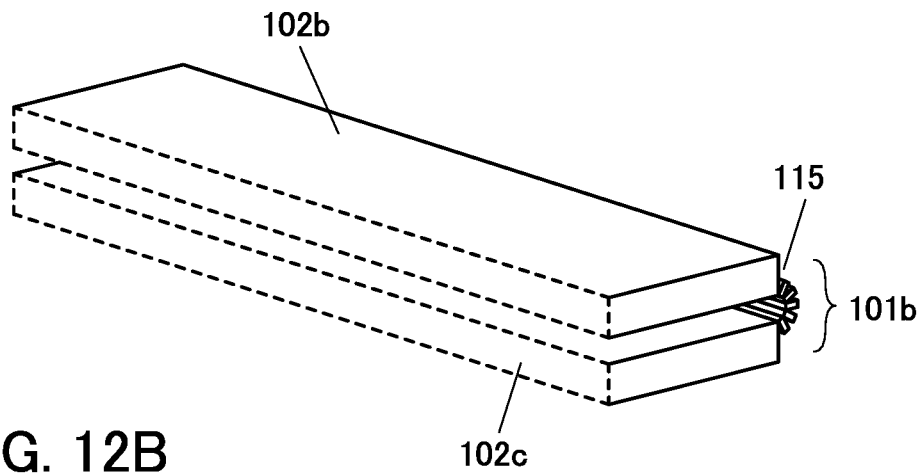
FIG. 12A to FIG. 12C are diagrams illustrating a hinge portion.
Figure 12B:
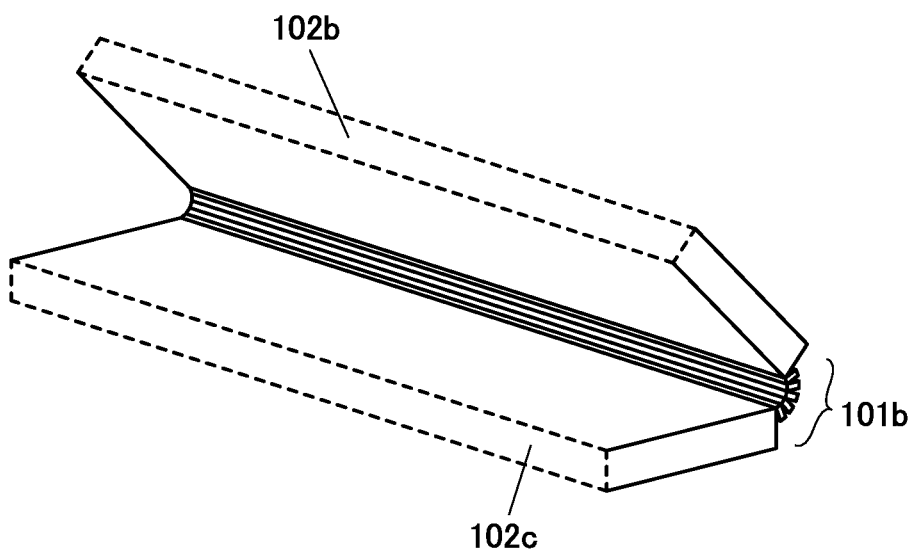
Figure 12C:
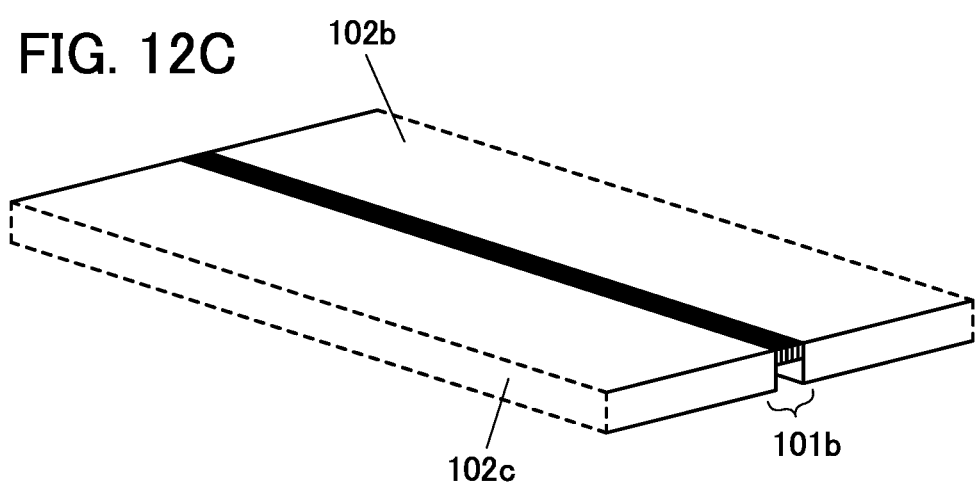

A structure illustrated in FIG. 12A to FIG. 12C can be used for the hinge portion 101b, for example.

The hinge portion 101b includes a plurality of columnar bodies 115 each with a rectangular or substantially rectangular cross section perpendicular to a major axis. The columnar body 115 includes a first side surface (a surface including one side of the rectangle or the substantial rectangle) and a second side surface facing the first side surface. Two adjacent columnar bodies 115 have a structure where the first side surface of one of the columnar bodies 115 is adjacent to the second side surface of the other of the columnar bodies 115. Some of the two adjacent columnar bodies 115 are directly connected to each other or connected to each other through another member, and their relative positions can be changed.

The columnar bodies 115 are coupled to each other such that third side surfaces that are perpendicular to the first side surfaces and the second side surfaces form a continuous surface. In addition, the third side surface of the columnar body 115 in one of end portions of the hinge portion 101b is connected to the second surface of the housing 102b so as to be continuous with the second surface of the housing 102b. Furthermore, the third side surface of the columnar body 115 in the other of the end portions of the hinge portion 101b is connected to the second surface of the housing 102c so as to be continuous with the second surface of the housing 102c. Note that the shape of a fourth side surface facing the third side surface of the columnar body 115 may be any shape as long as no interference occurs in the other columnar body.

As illustrated in FIG. 12A, when the first side surface of the one of the two adjacent columnar bodies 115 and the second side surface of the other of the columnar bodies 115 are transformed in a direction in which they are apart from each other, the flexible display panel can be set in a folded state. In that case, the third side surfaces of the two adjacent columnar bodies 115 are continuous with each other to form a certain angle, and a substantially arc-shaped region is formed in a cross section of the entire hinge portion 101b. Accordingly, in the flexible display panel, the component can form a concave curved surface in a portion overlapping the region.

When transformation operation (unfold operation) is performed from the state in FIG. 12A, the two adjacent columnar bodies 115 move in a direction where the first side surface of the one of the columnar bodies 115 becomes close to the second side surface of the other of the columnar bodies 115, as illustrated in FIG. 12B, and a curvature radius of the substantial arc changes so as to be larger. In that case, a curvature radius of a curved surface portion changes so as to be larger also in the display panel.

When transformation operation is further performed from the state in FIG. 12B, as illustrated in FIG. 12C, the second surface of the housing 102b, the third side surface of each of the columnar bodies 115, and the second surface of the housing 102c are continuous with each other so as to be flat. In that case, the curved surface portion of the display panel also changes so as to be flat, and the entire display panel is set in an unfolded state so as to be flat. When transformation operation is performed in an order opposite to the above, the display panel can be folded.

Note that since the cross section of the columnar body 115 is a rectangle, when the display panel is unfolded so as to be flat, in the two adjacent columnar bodies 115, the first side surface of the one of the columnar bodies 115 is in contact with the second side surface of the other of the columnar bodies 115. Accordingly, the hinge portion 101b does not cause bending of the display panel in an opposite direction, and mechanism to inhibit reverse bending may be unnecessary. Note that a spacer for keeping a gap between the housings during folding may be provided. In addition, the housing or the hinge may be transformed into a shape suitable for installation of the display panel as appropriate.

Figure 13A:
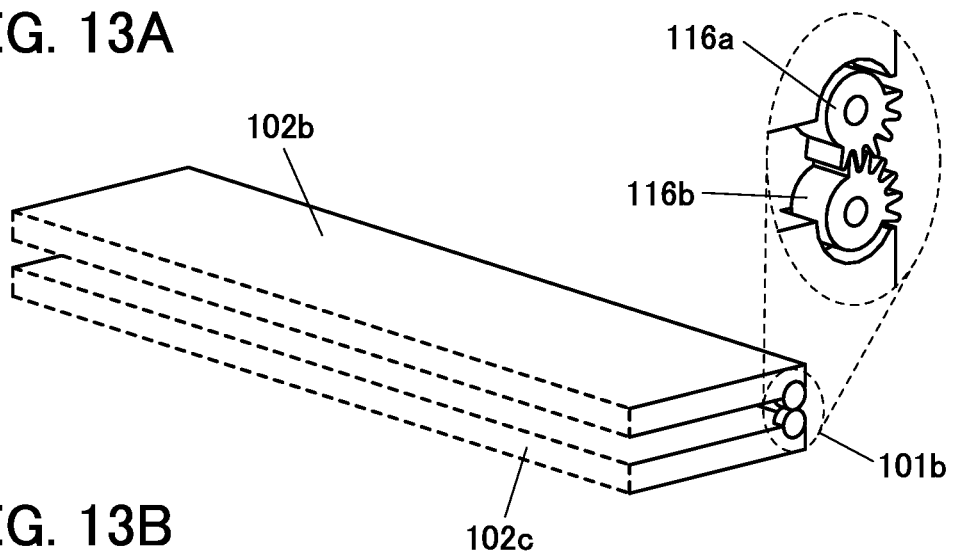
FIG. 13A to FIG. 13C are diagrams illustrating the hinge portion.
Figure 13B:
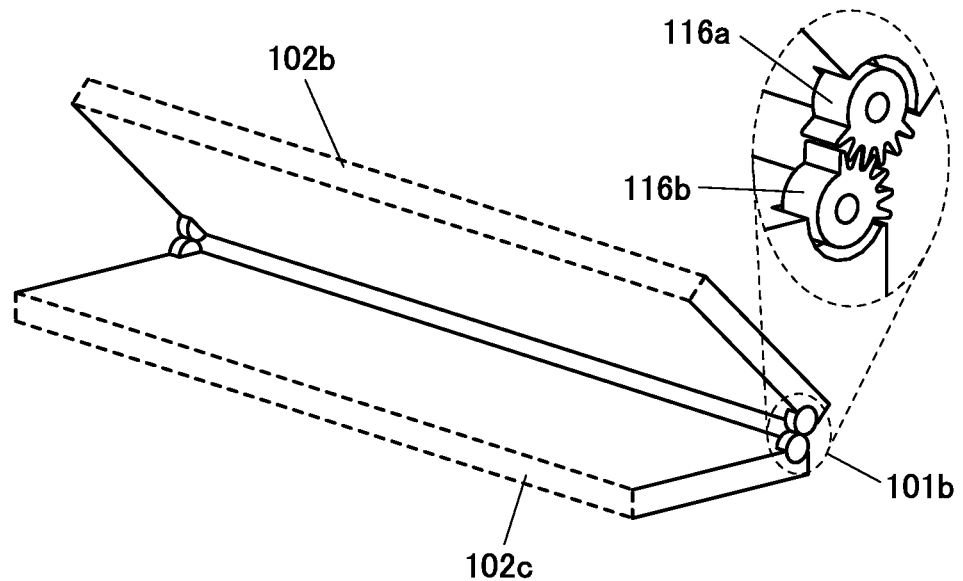
Figure 13C:
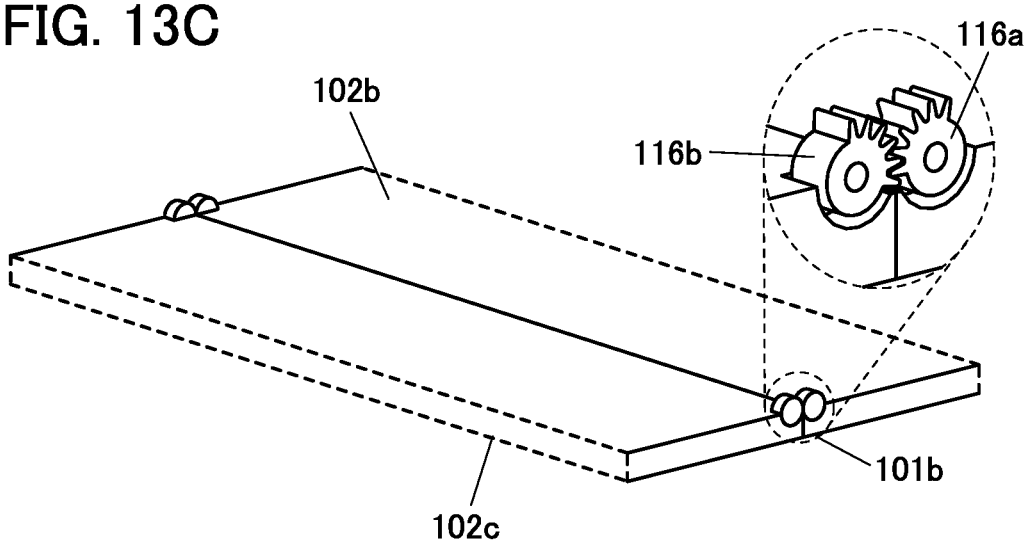

FIG. 13A to FIG. 13C are diagrams illustrating another example of the hinge portion 101b.

The hinge portion 101b includes a gear 116a and a gear 116b. The gear 116a is fixed to the housing 102b. The gear 116b is fixed to the housing 102c. A central axis of the gear 116a preferably overlaps the second surface of the housing 102b that is opposite to the first surface of the housing 102b. In addition, a central axis of the gear 116b preferably overlaps the second surface of the housing 102c that is opposite to the first surface of the housing 102c.

As illustrated in FIG. 13A, the gear 116a and the gear 116b are engaged with each other at a certain position in a folded state. In that case, the central axes of the two gears are on the second surfaces of the housings; thus, a gap is generated between the housings (between display surfaces of the display panel that face each other). Therefore, the flexible display panel can form a curved surface whose curvature radius is about the half of the gap.

When transformation operation (unfold operation) is performed from the state in FIG. 13A, the housing 102b and the housing 102c are in synchronization with each other in accordance with engagement between the gear 116a and the gear 116b and move to be opened with the hinge portion 101b used as a fulcrum (see FIG. 13B). In that case, a curvature radius of a curved surface portion changes so as to be larger also in the display panel.

When transformation operation is further performed from the state in FIG. 13B, as illustrated in FIG. 13C, the second surface of the housing 102b and the first surface of the housing 102c are continuous with each other so as to be flat. In that case, the curved surface portion of the display panel also changes so as to be flat, and the entire display panel is set in an unfolded state so as to be flat. When transformation operation is performed in an order opposite to the above, the display panel can be folded.

Note that mechanism for keeping the engagement between the gear 116a and the gear 116b may be provided. In addition, when the display panel is unfolded so as to be flat, a side surface of the housing 102b is in contact with a side surface of the housing 102c. Accordingly, the hinge portion 101b does not cause bending of the display panel in an opposite direction, and mechanism to inhibit reverse bending may be unnecessary. Note that a spacer for keeping a gap between the housings during folding may be provided. Alternatively, mechanism for keeping the gap may be provided in the gear 116a and the gear 116b. Furthermore, the housing or the hinge may be transformed into a shape suitable for installation of the display panel as appropriate.

FIG. 11B is a perspective view on the second surface sides of the housings 102a to 102c with a display device in an unfolded state. The flexible display panel 103 is provided on the second surface sides of the housings 102a to 102c.

Note that in this embodiment, for clarity of the description, the display panel 103 is divided into three regions: a region 103a, a region 103b, and a region 103c. The region 103a, the region 103b, and the region 103c are regions that are in parallel with a horizontal direction (a direction in which a surface of the display panel 103 extends) when the display panel 103 is unfolded so as to be flat and are regions bordered by a position where the hinge portion is provided or its vicinity. Note that actually, the regions 103a to 103c and their boundaries have no structural differences. One seamless flexible display panel can be used as the display panel 103.

FIG. 11C is a perspective view illustrating a folded state of a display device. The hinge portion 101a is compatible with outward bending where the display surface of the display panel 103 is a convex, and the hinge portion 101b is compatible with inward bending where the display surface of the display panel 103 is a concave. Accordingly, the display panel 103 can be folded in three, as illustrated in FIG. 11C.

Display Operation Example 1

Figure 14A:
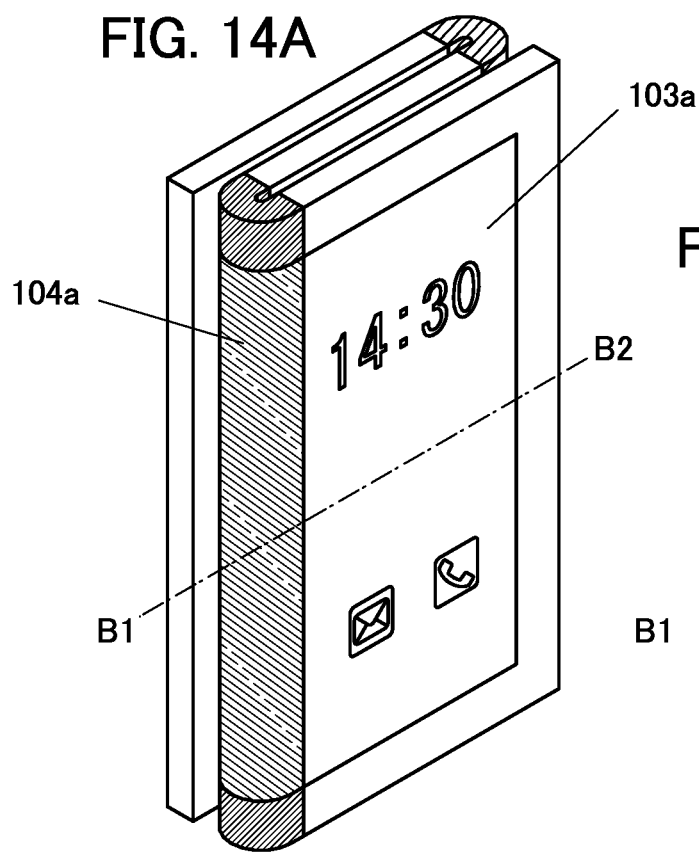
FIG. 14A to FIG. 14C are diagrams each illustrating operation of a display device.
Figure 14B:
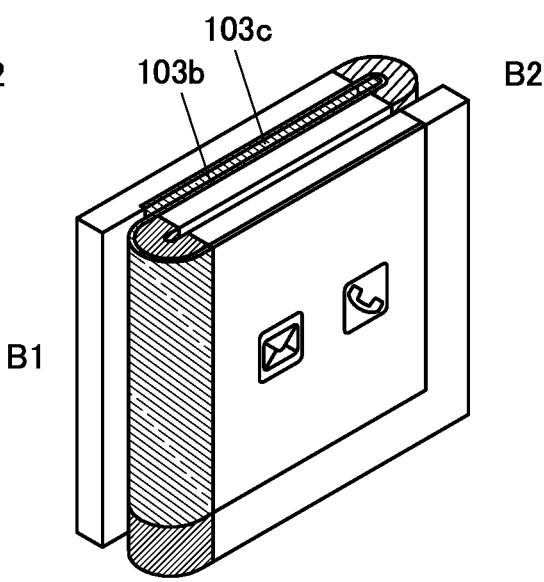
Figure 14C:
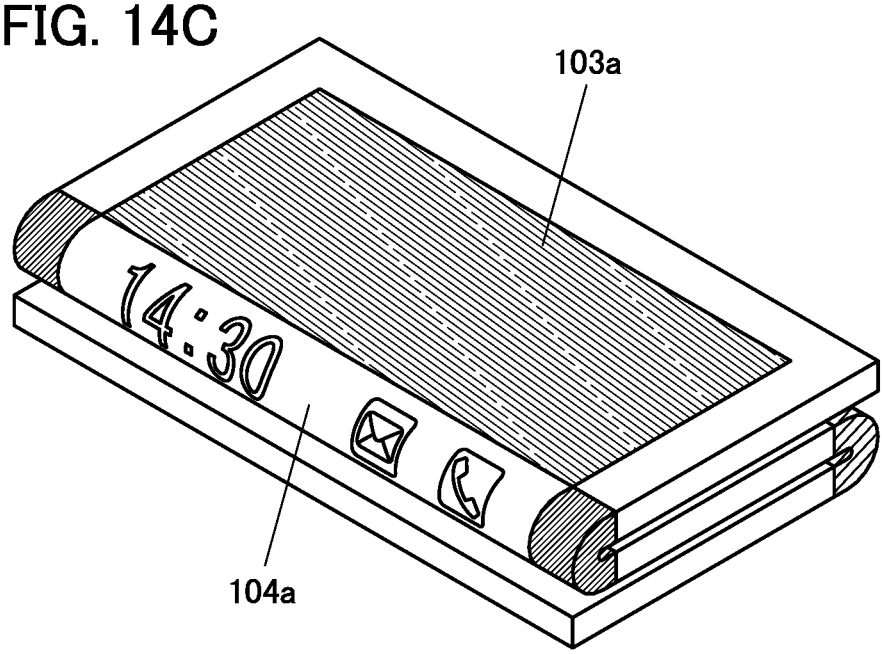

FIG. 14A to FIG. 14C are diagrams each illustrating an operation example of a display device according to one embodiment of the present invention. FIG. 14A is operation of setting a curved surface 104a (part of the region 103a and part of the region 103b) in a non-display state when the display device is in a folded state and a flat portion of the region 103a is in a display state. In that case, as illustrated in a B1-B2 cross section illustrated in FIG. 14B, folded regions that cannot be seen (the region 103b and the region 103c) are also preferably set in a non-display state.

Alternatively, as illustrated in FIG. 14C, when the flat portion of the region 103a is in a non-display state, the curved surface 104a may be set in a display state. As in FIG. 14A and FIG. 14B, the folded regions that cannot be seen are also preferably set in a non-display state. In this manner, when the display device is in a folded state and only some of the regions are set in a display state, power-saving operation can be performed.

Display Operation Example 2

Figure 15A:
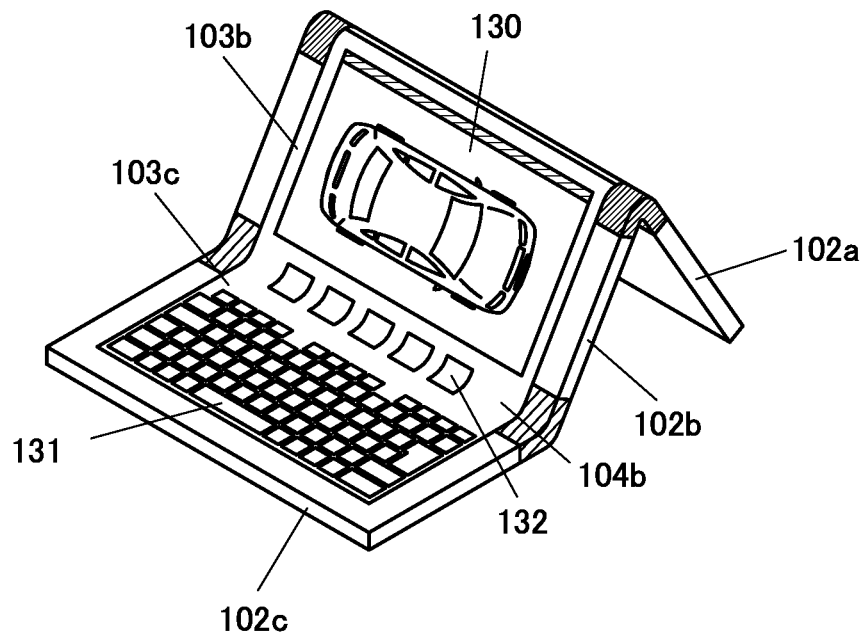
FIG. 15A to FIG. 15C are diagrams each illustrating operation of a display device.
Figure 15B:
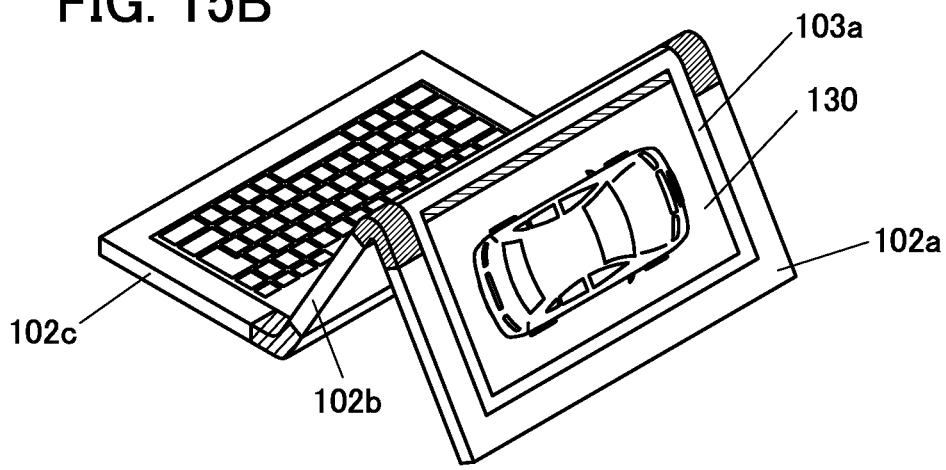
Figure 15C:
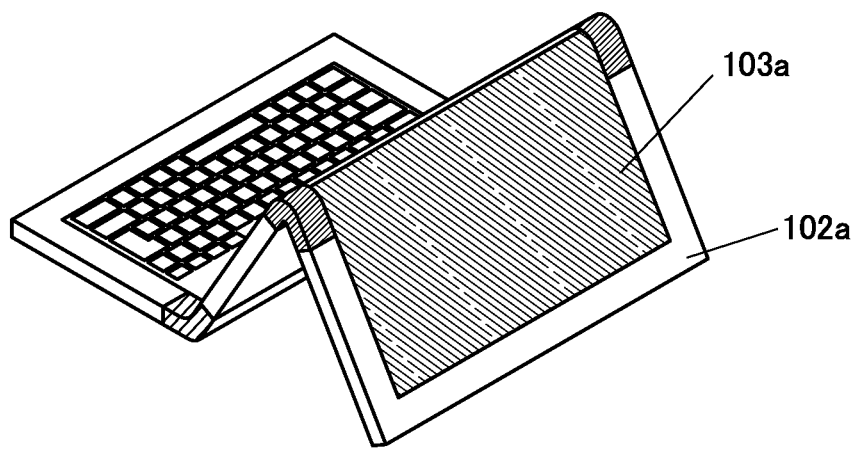

FIG. 15A to FIG. 15C are diagrams each illustrating an example in which a display portion of a display device according to one embodiment of the present invention is divided into three surfaces and utilized.

FIG. 15A is a diagram illustrating an example in which an angle formed by the housing 102c and the housing 102b is an obtuse angle and an angle formed by the housing 102b and the housing 102a is an acute angle so that the display device is set on a desk or the like in a balanced way. When the housing 102a is used as a leg, the display device can be utilized like a laptop computer. For example, operation can be performed by displaying a keyboard 131, an icon 132, and an image 130 of application software on the region 103c, a curved surface 104b (part of the region 103b and part of the region 103c), and the region 103b, respectively, and touching a screen.

In that case, when a mode is employed in which the same image 130 is also displayed on the region 103a, as illustrated in FIG. 15B, people on the opposite side can see the same image with high visibility. Alternatively, as illustrated in FIG. 15C, the display device may operate in a power-saving mode while the region 103a is in a non-display state.

Display Operation Example 3

Figure 16A:
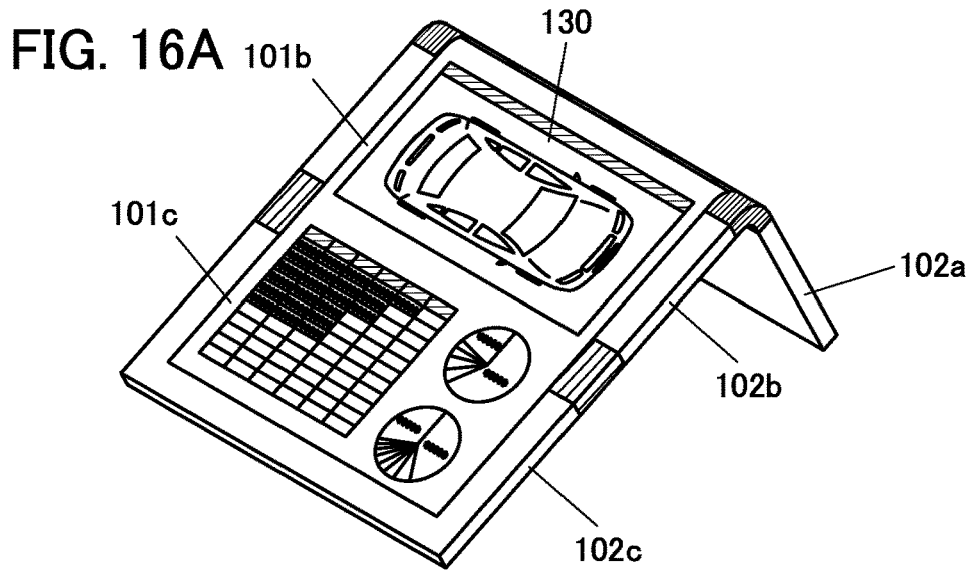
FIG. 16A to FIG. 16C are diagrams each illustrating operation of a display device.
Figure 16B:
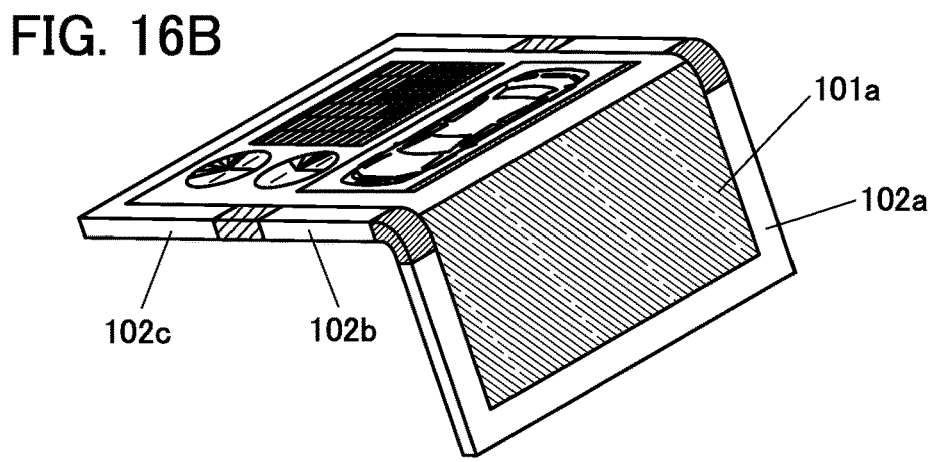
Figure 16C:
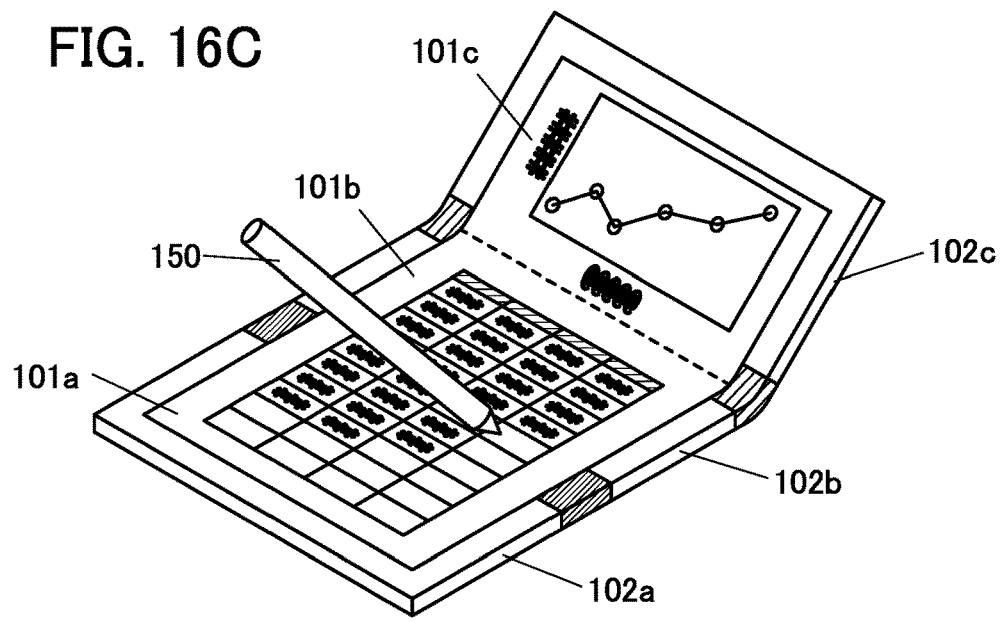

FIG. 16A to FIG. 16C are diagrams each illustrating an example in which a display portion of a display device according to one embodiment of the present invention is divided into two surfaces and utilized.

FIG. 16A is a diagram illustrating an example in which an angle formed by the housing 102a and the housing 102b is approximately greater than or equal to 60° and less than 180° (for example, approximately 90° or the like) and an angle formed by the housing 102b and the housing 102c is approximately 180° so that the display device is set on a desk or the like in a balanced way. When a larger screen is made by forming a continuous plane of the region 103b and the region 103c and a display surface (the region 103b and the region 103c) is tilted with the housing 102a used as a leg, visibility can be increased.

In that case, as illustrated in FIG. 16B, the display device may operate in a power-saving mode while the region 103a is in a non-display state.

FIG. 16C is a diagram illustrating an example in which an angle formed by the housing 102c and the housing 102b is approximately less than 180° and greater than or equal to 90° (for example, approximately 135° or the like) and an angle formed by the housing 102b and the housing 102a is approximately 180° so that the display device is set on a desk or the like in a balanced way. When the housing 102a and the housing 102b are placed in parallel with a plane, input using a stylus 150 or the like can be facilitated. In addition, when the region 103c is tilted, the visibility can be increased.

Application Example 1

Figure 17A:
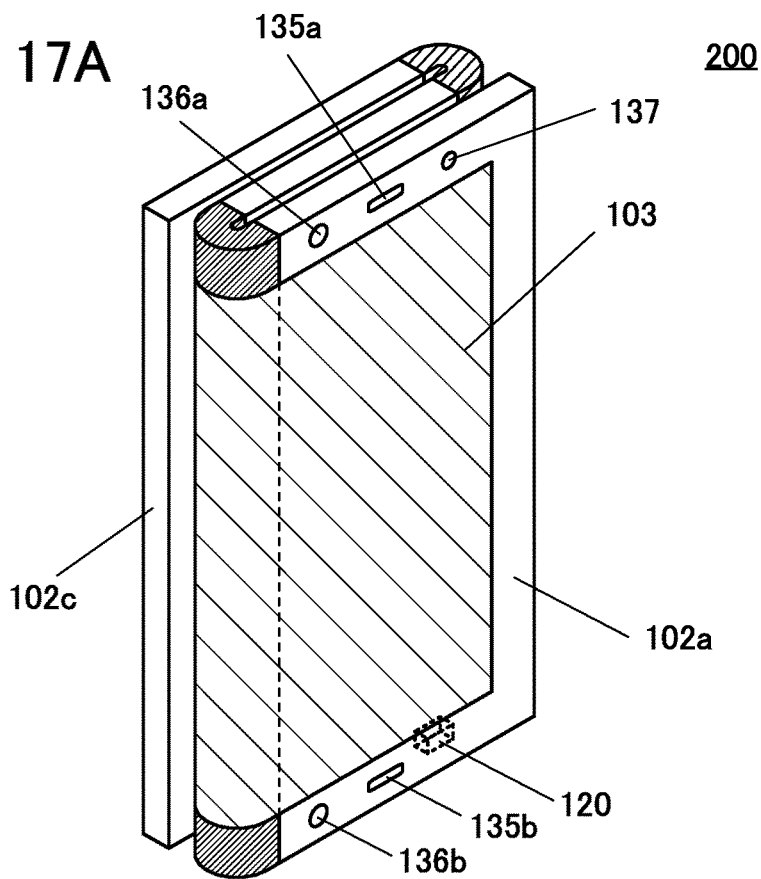
FIG. 17A and FIG. 17B are diagrams each illustrating an application example of a display device.
Figure 17B:
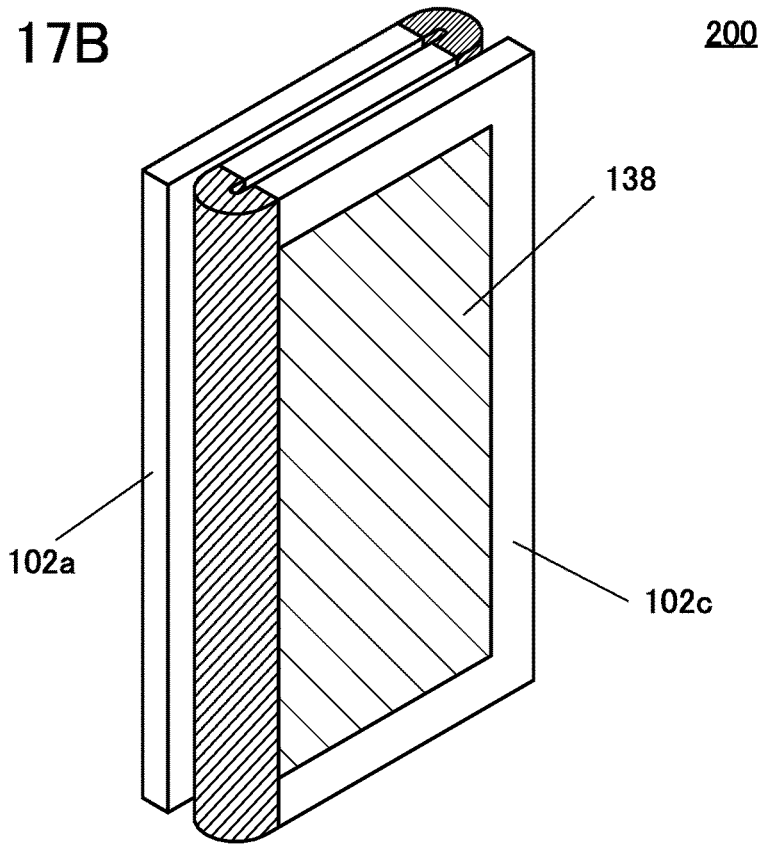

FIG. 17A and FIG. 17B are diagrams each illustrating an example in which a display device illustrated in this embodiment is applied to an information terminal such as a smartphone. Note that components common to the display device are denoted by the same reference numerals. A display device 200 includes audio input/output units 135a and 135b, cameras 136a and 136b, a sensor 137, and a sensor 120.

When one of the audio input/output units 135a and 135b functions as a microphone, the other of the audio input/output units 135a and 135b can function as a speaker. Therefore, when a telephone function is utilized, for example, it is possible to have a conversation without any inconvenience even when the audio input/output units 135a and 135b are held in either direction. The microphone function and the speaker function can be switched with each other by the sensor 120 that senses a tilt. In addition, either the cameras 136a and 136b can similarly function with a high priority by the sensor 120.

The input/output units 135a and 135b may include both of a device that functions as a microphone and a device that functions as a speaker or may include one device that has both functions.

Alternatively, both the input/output units 135a and 135b can function as microphones to record stereo sound. Alternatively, both the input/output units 135a and 135b can function as speakers to reproduce stereo sound.

In addition, both the cameras 136a and 136b can function and can capture 3D images. The sensor 137 is an optical sensor and can adjust display luminance so that the images can be easily seen in accordance with ambient illuminance.

In addition, as illustrated in FIG. 17B, a display panel 138 may be provided on a rear surface that is on a side opposite to a front surface of the display device 200 where the display panel 103 is provided. The display panel 138 can display the same image as the display panel 103. The display panel 138 can also be utilized as a sub-display that displays simple information, painting, a pattern, a picture, or the like; lighting; or the like. A display panel using a light-emitting device or a liquid crystal device can be used as the display panel 138, and low-power electronic paper or the like may be used as the display panel 138. A display panel using a hard substrate as a support can also be used as the display panel 138.

Figure 18A:
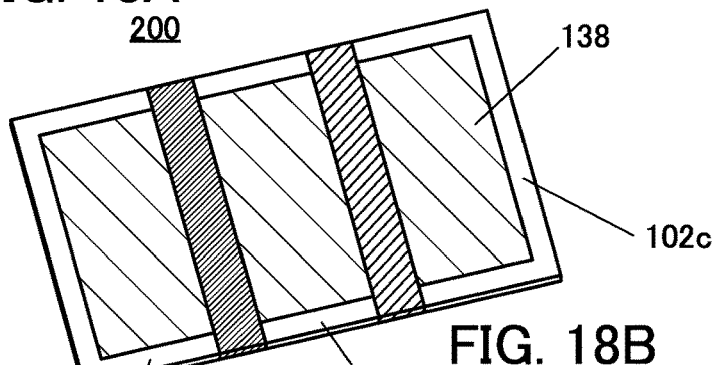
FIG. 18A to FIG. 18D are diagrams each illustrating an application example of the display device.
Figure 18B:
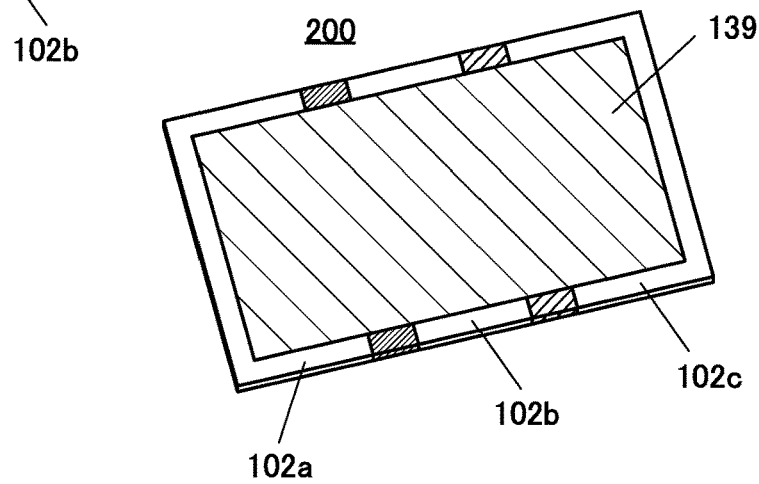

Note that as illustrated in FIG. 18A, the display panel 138 may be provided in each of the housings 102a to 102c. Alternatively, as illustrated in FIG. 18B, a flexible display panel 139 may be provided on the rear surface of the display device 200. In that case, the display panel 139 can be bent, so that the display panel 139 can be provided across the housings 102a to 102c, like the display panel 103 provided on the front surface.

Figure 18C:
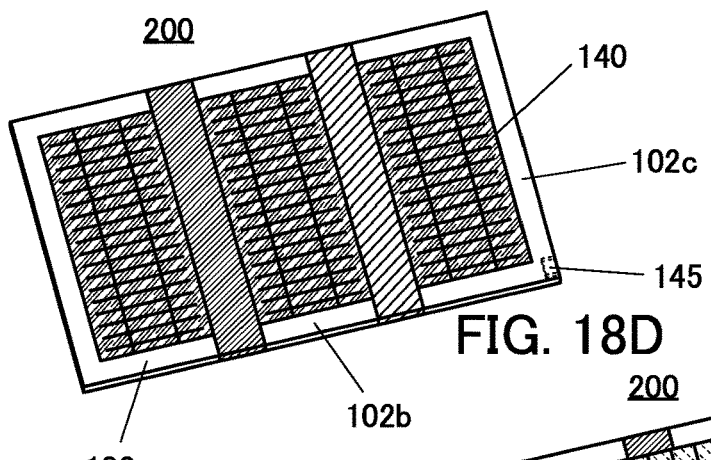

Alternatively, as illustrated in FIG. 18C, a solar battery 140 may be provided on the rear surface of the display device 200. A battery in the display device 200 can be charged with power generated by the solar battery 140, and the power can be supplied to the outside through an external interface 145.

Note that FIG. 18C illustrates an example of a solar battery including a hard support. As the solar battery, for example, a silicon solar battery using crystalline silicon for a photoelectric conversion layer, a solar battery with a tandem structure of a silicon solar battery and a perovskite type solar battery, or the like can be used.

Figure 18D:
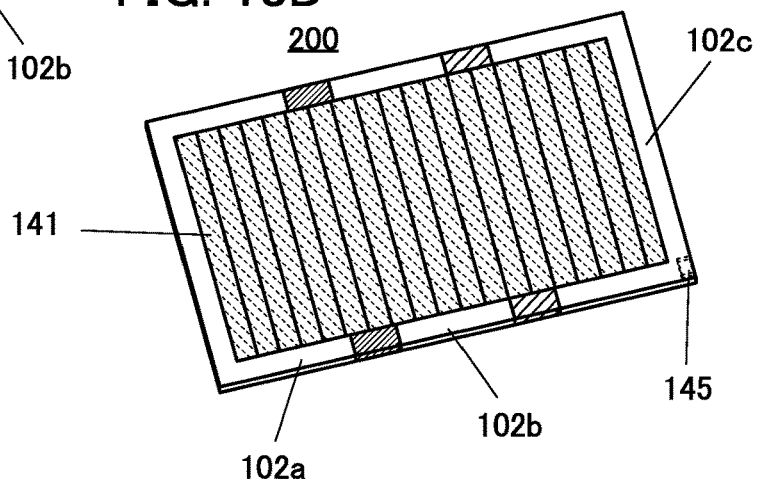

Alternatively, as illustrated in FIG. 18D, a solar battery using a flexible substrate as a support may be provided on the rear surface of the display device 200. As the solar battery, for example, a thin-film solar battery 141 such as an amorphous silicon solar battery, a CIGS (Cu—In—Ga—Se) type solar battery, an organic solar battery, or a perovskite type solar battery, or the like can be used. The solar battery using a flexible substrate as a support can be provided across the housings 102a to 102c, like the display panel 139.

Application Example 2

Figure 19A:
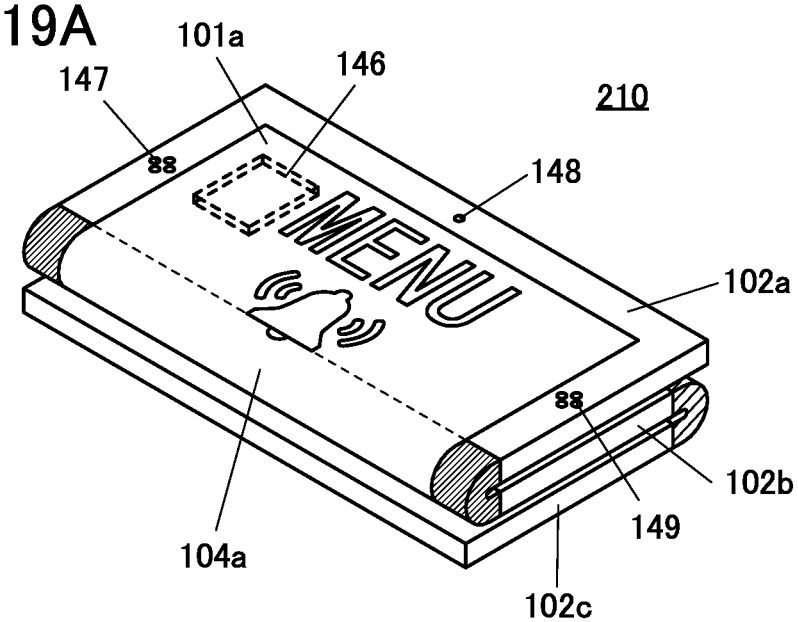
FIG. 19A and FIG. 19B are diagrams each illustrating an application example of a display device.
Figure 19B:
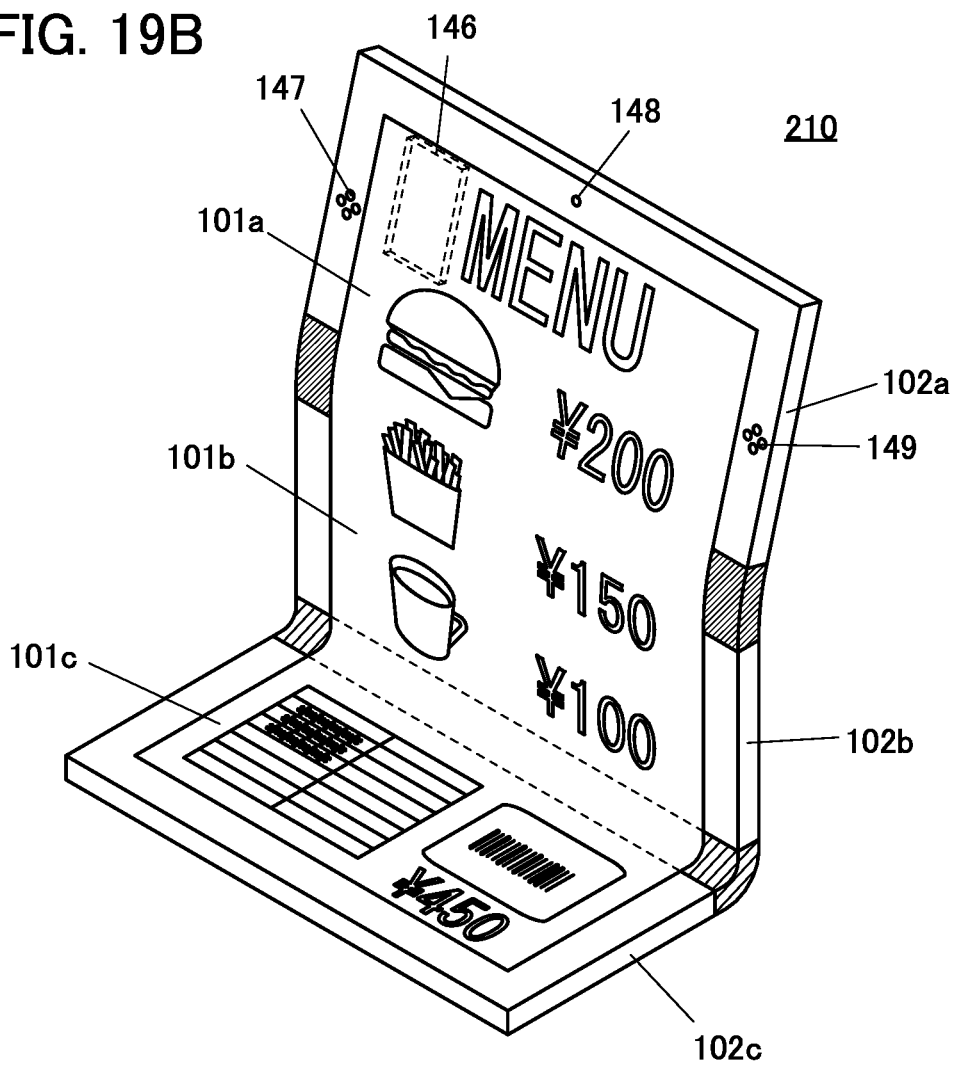

FIG. 19A and FIG. 19B are diagrams each illustrating an example in which a display portion of a display device according to one embodiment of the present invention is used properly depending on the application.

FIG. 19A and FIG. 19B are diagrams each illustrating an example in which a display device illustrated in this embodiment is applied to an order terminal in a restaurant or the like. Note that components common to the display device are denoted by the same reference numerals.

A display device 210 includes a transceiving unit 146, a speaker 147, a camera 148, a microphone 149, and the like. Note that the display device 210 may have functions of a general tablet type computer in addition to functions of one embodiment of the present invention.

In normal times, the display device 210 can be set in a folded state as illustrated in FIG. 19A, and a function of calling over a salesclerk or an intercom function can be utilized. When the display device 210 is unfolded, a menu can be displayed and an order can be placed. Ordered items can be transmitted through the transceiving unit 146. In addition, display of the total amount of order and payment with a barcode captured by the camera 148 can be performed.

Note that as the shape of the display device 210 when being unfolded, it is preferable that the housing 102a and the housing 102b form an obtuse angle and that the housing 102b and the housing 102c form an angle of approximately 90°. With such a shape, the housing 102c can be used as a leg and can be folded easily.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 2

In this embodiment, a structure example of a display panel that can be applied to the display device according to one embodiment of the present invention is described.

Structure Example

Figure 20:
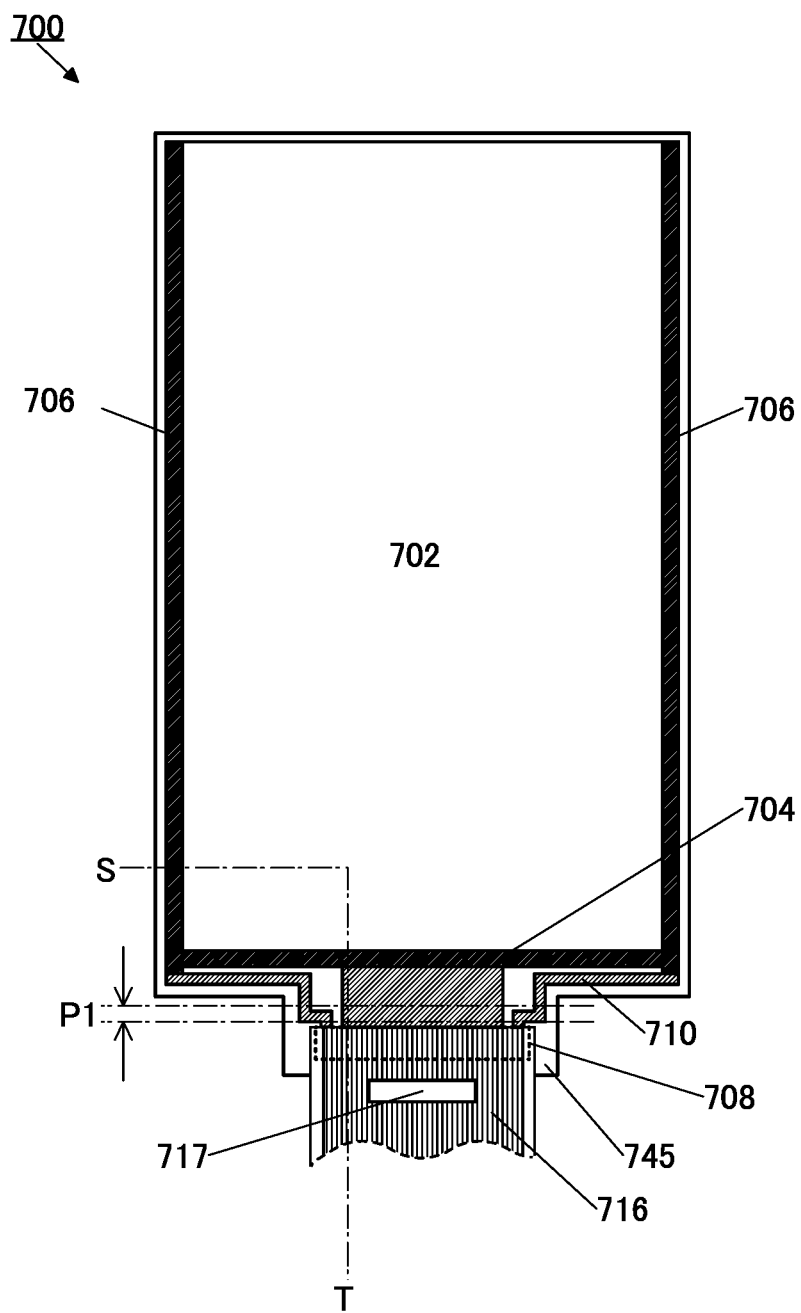
FIG. 20 is a diagram illustrating a structure example of a display panel.

FIG. 20 illustrates a top view of a display panel 700. The display panel 700 is a display panel that employs a flexible support substrate 745 and can be used as a flexible display. In addition, the display panel 700 includes a pixel portion 702 provided over the flexible support substrate 745. Furthermore, a source driver circuit portion 704, a pair of gate driver circuit portions 706, a wiring 710, and the like are provided over the support substrate 745. Moreover, a plurality of display devices are provided in the pixel portion 702.

In addition, part of the support substrate 745 is provided with an FPC terminal portion 708 to which an FPC 716 (FPC: Flexible printed circuit) is connected. The pixel portion 702, the source driver circuit portion 704, and the gate driver circuit portions 706 are each supplied with a variety of signals and the like from the FPC 716 through the FPC terminal portion 708 and the wiring 710.

The pair of gate driver circuit portions 706 is provided on both sides with the pixel portion 702 sandwiched therebetween. Note that the gate driver circuit portions 706 and the source driver circuit portion 704 may be formed separately on semiconductor substrates or the like to form packaged IC chips. The IC chips can be mounted on the support substrate 745 by a COF (Chip On Film) technique or the like.

Transistors including an OS are preferably applied to transistors included in the pixel portion 702, the source driver circuit portion 704, and the gate driver circuit portions 706.

Light-emitting devices or the like can be used as the display devices in the pixel portion 702. Examples of light-emitting devices are self-luminous light-emitting devices such as an LED (Light Emitting Diode), an OLED (Organic LED), a QLED (Quantum-dot LED), a semiconductor laser, and the like. Alternatively, liquid crystal devices such as transmissive liquid crystal devices, reflective liquid crystal devices, or semi-transmissive liquid crystal devices can also be used as the display devices. Alternatively, shutter type or optical interference type MEMS (Micro Electro Mechanical Systems) devices; display devices employing a microcapsule method, an electrophoretic method, an electrowetting method, an Electronic Liquid Powder (registered trademark) method, or the like; and the like can also be used.

In addition, FIG. 20 illustrates an example where the support substrate 745 has a shape in which a portion provided with the FPC terminal portion 708 is projected. In a region P1 in FIG. 20, part of the support substrate 745 that includes the FPC terminal portion 708 can be bent backward. Bending the part of the support substrate 745 backward enables the FPC 716 to be placed in a state overlapping a rear side of the pixel portion 702 when the display panel 700 is mounted on an electronic device or the like, so that the electronic device or the like can be space-saving or small-sized.

In addition, an IC 717 is mounted on the FPC 716 connected to the display panel 700. The IC 717 has a function of a source driver circuit, for example. In that case, a structure can be employed in which the source driver circuit portion 704 in the display panel 700 includes at least one of a protection circuit, a buffer circuit, a demultiplexer circuit, and the like.

Cross-Sectional Structure Example

Structures using organic EL as the display device are described below using FIG. 21 and FIG. 22. Each of FIG. 21 and FIG. 22 is a schematic cross-sectional view of the display panel 700 illustrated in FIG. 20 along a dash-dot line S-T.

Figure 21:
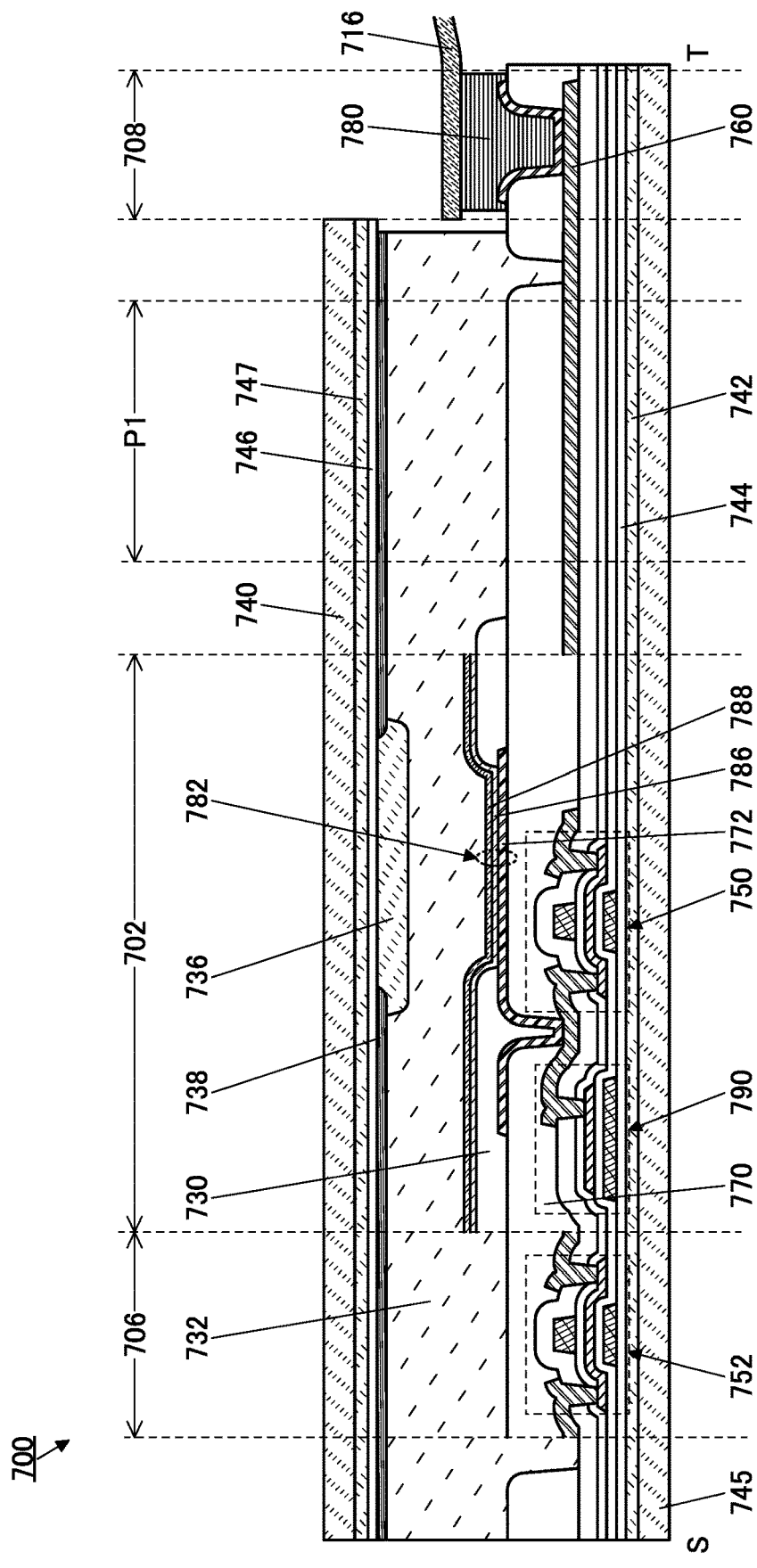
FIG. 21 is a diagram illustrating a structure example of the display panel.
Figure 22:
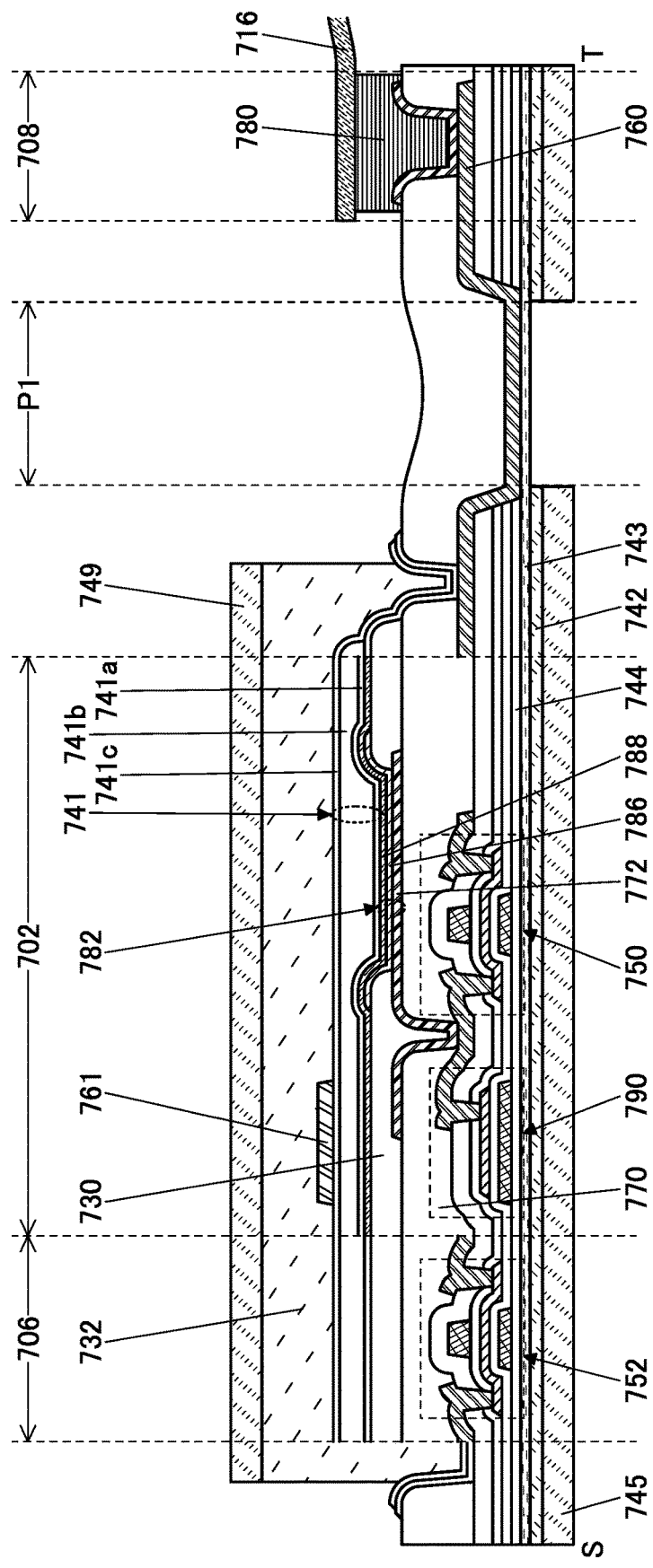
FIG. 22 is a diagram illustrating a structure example of a display panel.

First, portions common to the display panels illustrated in FIG. 21 and FIG. 22 are described.

FIG. 21 and FIG. 22 illustrate cross sections including the pixel portion 702, the gate driver circuit portion 706, and the FPC terminal portion 708. The pixel portion 702 includes a transistor 750 and a capacitor 790. The gate driver circuit portion 706 includes a transistor 752.

Each of the transistor 750 and the transistor 752 is a transistor in which an oxide semiconductor is employed for a semiconductor layer where a channel is formed. Note that the transistors are not limited thereto, and a transistor using silicon (amorphous silicon, polycrystalline silicon, or single-crystal silicon) or a transistor using an organic semiconductor for a semiconductor layer can be employed.

The transistor used in this embodiment includes a highly purified oxide semiconductor film in which formation of oxygen vacancies is suppressed. The transistor can have extremely low off-state current. Accordingly, in the pixel employing such a transistor, the retention time of an electric signal such as an image signal can be extended, and an interval between writings of an image signal or the like can also be set longer. Accordingly, the frequency of refresh operations can be reduced, so that power consumption can be reduced.

In addition, the transistor used in this embodiment can have comparatively high field-effect mobility and thus is capable of high-speed driving. For example, with such a transistor capable of high-speed driving used for the display panel, a switching transistor in a pixel portion and a driver transistor used in a driver circuit portion can be formed over the same substrate. In other words, a structure in which a driver circuit formed using a silicon wafer or the like is not employed is possible, and the number of components of the display device can be reduced. Furthermore, the use of the transistor capable of high-speed driving also in the pixel portion can provide a high-quality image.

The capacitor 790 includes a lower electrode formed by processing the same film as a film for a first gate electrode of the transistor 750 and an upper electrode formed by processing the same metal oxide film as a film for the semiconductor layer. The upper electrode has reduced resistance like a source region and a drain region of the transistor 750. In addition, part of an insulating film functioning as a first gate insulating layer of the transistor 750 is provided between the lower electrode and the upper electrode. That is, the capacitor 790 has a stacked-layer structure in which an insulating film functioning as a dielectric film is sandwiched between a pair of electrodes. Furthermore, a wiring obtained by processing the same film as a film for a source electrode and a drain electrode of the transistor 750 is connected to the upper electrode.

In addition, an insulating layer 770 that functions as a planarization film is provided over the transistor 750, the transistor 752, and the capacitor 790.

As the transistor 750 included in the pixel portion 702 and the transistor 752 included in the source driver circuit portion 704, transistors having different structures may be used. For example, a structure may be employed in which a top-gate transistor is used as one of the transistors 750 and 752 and a bottom-gate transistor is used as the other of the transistors 750 and 752. Note that the same applies to the source driver circuit portion 704, as in the gate driver circuit portion 706.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. Here, the wiring 760 is formed using the same conductive film as the source electrode and the drain electrode of the transistor 750 or the like.

Next, the display panel 700 illustrated in FIG. 21 is described.

The display panel 700 illustrated in FIG. 21 includes the support substrate 745 and a support substrate 740. As each of the support substrate 745 and the support substrate 740, a glass substrate or a flexible substrate such as a plastic substrate can be used, for example.

The transistor 750, the transistor 752, the capacitor 790, and the like are provided over the insulating layer 744. The support substrate 745 and the insulating layer 744 are attached to each other with an adhesive layer 742.

In addition, the display panel 700 includes a light-emitting device 782, a coloring layer 736, a light-blocking layer 738, and the like.

The light-emitting device 782 includes a conductive layer 772, an EL layer 786, and a conductive layer 788. The conductive layer 772 is electrically connected to the source electrode or the drain electrode included in the transistor 750. The conductive layer 772 is provided over the insulating layer 770 and functions as a pixel electrode. In addition, an insulating layer 730 is provided to cover an end portion of the conductive layer 772. Over the insulating layer 730 and the conductive layer 772, the EL layer 786 and the conductive layer 788 are stacked and provided.

For the conductive layer 772, a material having a property of reflecting visible light can be used. For example, a material including aluminum, silver, or the like can be used. For the conductive layer 788, a material having a property of transmitting visible light can be used. For example, an oxide material including indium, zinc, tin, or the like is preferably used. Thus, the light-emitting device 782 is a top-emission light-emitting device that emits light to a side opposite a formation surface (a support substrate 740 side).

The EL layer 786 includes an organic compound or an inorganic compound such as quantum dots. The EL layer 786 includes a light-emitting material that exhibits blue light when current flows.

As the light-emitting material, a fluorescent material, a phosphorescent material, a thermally activated delayed fluorescence (TADF) material, an inorganic compound (a quantum dot material or the like), or the like can be used. Examples of materials that can be used for quantum dots include a colloidal quantum dot material, an alloyed quantum dot material, a core-shell quantum dot material, a core quantum dot material, and the like.

The light-blocking layer 738 and the coloring layer 736 are provided on one surface of an insulating layer 746. The coloring layer 736 is provided in a position overlapping the light-emitting device 782. In addition, the light-blocking layer 738 is provided in a region not overlapping the light-emitting device 782 in the pixel portion 702. Furthermore, the light-blocking layer 738 may also be provided to overlap the gate driver circuit portion 706 or the like.

The support substrate 740 is attached to the other surface of the insulating layer 746 with an adhesive layer 747. In addition, the support substrate 740 and the support substrate 745 are attached to each other with a sealing layer 732.

Here, for the EL layer 786 included in the light-emitting device 782, a light-emitting material that exhibits white light emission is employed. White light emission by the light-emitting device 782 is colored by the coloring layer 736 to be emitted to the outside. The EL layer 786 is provided over the pixels that exhibit different colors. The pixels provided with the coloring layer 736 transmitting any of red (R), green (G), and blue (B) are arranged in a matrix in the pixel portion, so that the display panel 700 can perform full-color display.

In addition, a conductive film having a semi-transmissive property and a semi-reflective property may be used for the conductive layer 788. In that case, a microcavity structure is achieved between the conductive layer 772 and the conductive layer 788 such that light of a specific wavelength can be intensified to be emitted. Also at this time, a structure may be employed in which an optical adjustment layer for adjusting an optical distance is placed between the conductive layer 772 and the conductive layer 788 such that the thickness of the optical adjustment layer differs between pixels of different colors and accordingly the color purity of light emitted from each pixel is increased.

Note that a structure in which the coloring layer 736 or the optical adjustment layer is not provided may be employed when the EL layer 786 is formed into an island shape for each pixel or into a stripe shape for each pixel column, i.e., the EL layer 786 is formed by separate coloring.

Here, an inorganic insulating film that functions as a barrier film having low permeability is preferably used for each of the insulating layer 744 and the insulating layer 746. With a structure in which the light-emitting device 782, the transistor 750, and the like are sandwiched between the insulating layer 744 and the insulating layer 746, degradation thereof can be inhibited and a highly reliable display panel can be achieved.

In a display panel 700A illustrated in FIG. 22, a resin layer 743 is provided between the adhesive layer 742 and the insulating layer 744 illustrated in FIG. 21. In addition, a protective layer 749 is provided instead of the support substrate 740.

The resin layer 743 is a layer including an organic resin such as polyimide or acrylic. The insulating layer 744 includes an inorganic insulating film of silicon oxide, silicon oxynitride, silicon nitride, or the like. The resin layer 743 and the support substrate 745 are attached to each other with the adhesive layer 742. The resin layer 743 is preferably thinner than the support substrate 745.

The protective layer 749 is attached to the sealing layer 732. A glass substrate, a resin film, or the like can be used as the protective layer 749. Alternatively, as the protective layer 749, an optical member such as a polarizing plate (including a circularly polarizing plate) or a scattering plate, an input device such as a touch sensor panel, or a structure in which two or more of these are stacked may be employed.

In addition, the EL layer 786 included in the light-emitting device 782 is provided over the insulating layer 730 and the conductive layer 772 in an island shape. The EL layers 786 are formed separately so that respective subpixels emit light of different colors, so that color display can be performed without the use of the coloring layer 736.

In addition, a protective layer 741 is provided to cover the light-emitting device 782. The protective layer 741 has a function of preventing diffusion of impurities such as water into the light-emitting device 782. The protective layer 741 has a stacked-layer structure in which an insulating layer 741a, an insulating layer 741b, and an insulating layer 741c are stacked in this order from the conductive layer 788 side. In that case, it is preferable that inorganic insulating films with a high barrier property against impurities such as water be used as the insulating layer 741a and the insulating layer 741c and an organic insulating film that functions as a planarization film be used as the insulating layer 741b. Furthermore, the protective layer 741 is preferably provided to extend also to the gate driver circuit portion 706.

In addition, an organic insulating film covering the transistor 750, the transistor 752, and the like is preferably formed in an island shape inward from the sealing layer 732. In other words, an end portion of the organic insulating film is preferably inward from the sealing layer 732 or in a region overlapping an end portion of the sealing layer 732. FIG. 22 illustrates an example in which the insulating layer 770, the insulating layer 730, and the insulating layer 741b are processed into island shapes. The insulating layer 741c and the insulating layer 741a are provided in contact with each other in a portion overlapping the sealing layer 732, for example. Thus, when a structure is employed in which a surface of the organic insulating film covering the transistor 750 and the transistor 752 is not exposed to the outside of the sealing layer 732, diffusion of water or hydrogen from the outside to the transistor 750 and the transistor 752 through the organic insulating film can be favorably prevented. This can reduce variations in electrical characteristics of the transistors, so that a display device with extremely high reliability can be achieved.

In addition, in FIG. 22, the region P1 that can be bent includes a portion where the support substrate 745, the adhesive layer 742, and the inorganic insulating film such as the insulating layer 744 are not provided. Furthermore, the region P1 has a structure in which the insulating layer 770 including an organic material covers the wiring 760 so that the wiring 760 is not exposed. When a structure is employed in which an inorganic insulating film is not provided as long as possible in the region P1 that can be bent and only a conductive layer containing a metal or an alloy and a layer containing an organic material are stacked, generation of cracks caused at bending can be prevented. Moreover, when the support substrate 745 is not provided in the region P1, part of the display panel 700A can be bent with an extremely small curvature radius.

In addition, in FIG. 22, a conductive layer 761 is provided over the protective layer 741. The conductive layer 761 can be used as a wiring or an electrode.

In addition, in the case where a touch sensor is provided to overlap the display panel 700A, the conductive layer 761 can function as an electrostatic shielding film for preventing transmission of electrical noise to the touch sensor during pixel driving. In that case, a structure in which a predetermined constant potential is applied to the conductive layer 761 may be employed.

Alternatively, the conductive layer 761 can be used as an electrode of the touch sensor, for example. This enables the display panel 700A to function as a touch panel. For example, the conductive layer 761 can be used as an electrode or a wiring of a capacitive touch sensor. In that case, the conductive layer 761 can be used as a wiring or an electrode to which a sensor circuit is connected or a wiring or an electrode to which a sensor signal is input. When the touch sensor is formed over the light-emitting device 782 in this manner, the number of components can be reduced, and manufacturing cost of an electronic device or the like can be reduced.

The conductive layer 761 is preferably provided in a portion not overlapping the light-emitting device 782. The conductive layer 761 can be provided in a position overlapping the insulating layer 730, for example. Thus, a transparent conductive film with a comparatively low conductivity is not necessarily used for the conductive layer 761, and a metal or an alloy having high conductivity or the like can be used, so that the sensitivity of the sensor can be increased.

Note that as the type of the touch sensor that can be formed using the conductive layer 761, a variety of types such as a resistive type, a surface acoustic wave type, an infrared type, an optical type, and a pressure-sensitive type can be used, without limitation to a capacitive type. Alternatively, two or more of these may be combined and used.

<Components>

Components such as a transistor that can be employed in the display device will be described below.

[Transistor]

The transistors each include a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor included in the display device according to one embodiment of the present invention. For example, a planar transistor, a staggered transistor, or an inverted staggered transistor may be used. In addition, a top-gate or bottom-gate transistor structure may be employed. Alternatively, gate electrodes may be provided above and below a channel.

There is no particular limitation on the crystallinity of a semiconductor material used for the transistors, and any of an amorphous semiconductor and a crystalline semiconductor (a microcrystalline semiconductor, a polycrystalline semiconductor, a single-crystal semiconductor, or a semiconductor partly including crystal regions) may be used. It is preferable that a crystalline semiconductor be used because degradation of the transistor characteristics can be suppressed.

In particular, a transistor that uses a metal oxide film for a semiconductor layer where a channel is formed will be described below.

As a semiconductor material used for the transistors, a metal oxide whose energy gap is greater than or equal to 2 eV, preferably greater than or equal to 2.5 eV, further preferably greater than or equal to 3 eV can be used. Typically, an oxide semiconductor containing indium, or the like can be used, and for example, a CAAC-OS, a CAC-OS, or the like described later can be used. A CAAC-OS has a crystal structure including stable atoms and is suitable for a transistor that puts emphasis on reliability, and the like. A CAC-OS exhibits excellent mobility characteristics and thus is suitable for a transistor that is driven at high speed, for example.

In an OS transistor, a semiconductor layer has a large energy gap, and thus the OS transistor can exhibit characteristics with an extremely low off-state current of several yoctoamperes per micrometer (a current value per micrometer of channel width). In addition, an OS transistor has features such that impact ionization, an avalanche breakdown, a short-channel effect, and the like do not occur, which are different from those of a Si transistor, and can form a highly reliable circuit. Furthermore, variations in electrical characteristics due to crystallinity unevenness, which are issues in Si transistors, are less likely to occur in OS transistors.

A semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium). The In-M-Zn-based oxide can be formed by, for example, a sputtering method, an ALD (Atomic layer deposition) method, an MOCVD (Metal organic chemical vapor deposition) method, or the like.

In the case where an In-M-Zn-based oxide is deposited by a sputtering method, it is preferable that the atomic ratio of metal elements in a sputtering target satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio in the deposited semiconductor layer varies from the atomic ratio of metal elements of the sputtering target in a range of ±40%.

A metal oxide film with a low carrier density is used as the semiconductor layer. For example, for the semiconductor layer, a metal oxide whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such a metal oxide is referred to as a highly purified intrinsic or substantially highly purified intrinsic metal oxide. The oxide semiconductor has a low density of defect states and thus can be regarded as a metal oxide having stable characteristics.

Note that, without limitation to those described above, an oxide semiconductor with an appropriate composition may be used in accordance with required semiconductor characteristics and electrical characteristics (field-effect mobility, threshold voltage, and the like) of the transistor. In addition, to obtain the required semiconductor characteristics of the transistor, it is preferable that the carrier density, the impurity concentration, the density of defect states, the atomic ratio between a metal element and oxygen, the interatomic distance, the density, and the like of the semiconductor layer be set to appropriate values.

When silicon or carbon, which is one of Group 14 elements, is contained in the metal oxide contained in the semiconductor layer, oxygen vacancies are increased in the semiconductor layer, and the semiconductor layer becomes n-type. Thus, the concentration of silicon or carbon (concentration obtained by secondary ion mass spectrometry) in the semiconductor layer is set to lower than or equal to $2\times10^{18}$ atoms/cm$^3$, preferably lower than or equal to $2\times10^{17}$ atoms/cm$^3$.

In addition, alkali metal and alkaline earth metal might generate carriers when bonded to a metal oxide, in which case the off-state current of the transistor might be increased. Thus, the concentration of alkali metal or alkaline earth metal in the semiconductor layer that is obtained by secondary ion mass spectrometry is set to lower than or equal to $1\times10^{18}$ atoms/cm$^3$, preferably lower than or equal to $2\times10^{16}$ atoms/cm$^3$.

In addition, when nitrogen is contained in the metal oxide contained in the semiconductor layer, electrons serving as carriers are generated and the carrier density increases, so that the semiconductor layer easily becomes n-type. As a result, a transistor using a metal oxide that contains nitrogen is likely to have normally-on characteristics. Accordingly, the nitrogen concentration in the semiconductor layer that is obtained by secondary ion mass spectrometry is preferably set to lower than or equal to $5\times10^{18}$ atoms/cm$^3$.

In addition, when hydrogen is contained in an oxide semiconductor included in the semiconductor layer, hydrogen reacts with oxygen bonded to a metal atom to be water, and thus sometimes causes an oxygen vacancy in the oxide semiconductor. When a channel formation region in the oxide semiconductor includes oxygen vacancies, the transistor sometimes has normally-on characteristics. Furthermore, in some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defect quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" described in this specification and the like can be replaced with "donor concentration" in some cases.

Therefore, hydrogen in the oxide semiconductor is preferably reduced as much as possible. Specifically, the hydrogen concentration in the oxide semiconductor that is obtained by secondary ion mass spectrometry (SIMS) is set to lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

In addition, oxide semiconductors (metal oxides) can be classified into a single crystal oxide semiconductor and a non-single-crystal oxide semiconductor. Examples of the non-single-crystal oxide semiconductors include a CAAC-OS (C-Axis-Aligned Crystalline Oxide Semiconductor), a polycrystalline oxide semiconductor, an nc-OS (nanocrystalline oxide semiconductor), an amorphous-like oxide semiconductor (a-like OS), an amorphous oxide semiconductor, and the like. Among non-single-crystal structures, an amorphous structure has the highest density of defect states, whereas the CAAC-OS has the lowest density of defect states.

An oxide semiconductor film having an amorphous structure has disordered atomic arrangement and no crystalline component, for example. Alternatively, an oxide film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

In addition, a CAC-OS (Cloud-Aligned Composite oxide semiconductor) may be used for a semiconductor layer of a transistor disclosed in one embodiment of the present invention.

Note that the non-single-crystal oxide semiconductor or CAC-OS can be suitably used for a semiconductor layer of a transistor disclosed in one embodiment of the present invention. In addition, as the non-single-crystal oxide semiconductor, the nc-OS or the CAAC-OS can be suitably used.

Note that in one embodiment of the present invention, a CAC-OS is preferably used for a semiconductor layer of a transistor. The use of the CAC-OS allows the transistor to have high electrical characteristics or high reliability.

Note that the semiconductor layer may be a mixed film including two or more kinds of a region of a CAAC-OS, a region of a polycrystalline oxide semiconductor, a region of an nc-OS, a region of an amorphous-like oxide semiconductor, and a region of an amorphous oxide semiconductor. The mixed film has, for example, a single-layer structure or a stacked-layer structure including two or more kinds of the above regions in some cases.

<Composition of CAC-OS>

The composition of a CAC (Cloud-Aligned Composite)-OS that can be used in a transistor disclosed in one embodiment of the present invention is described below.

The CAC-OS is, for example, a composition of a material in which elements that constitute a metal oxide are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in a metal oxide is referred to as a mosaic pattern or a patch-like pattern.

Note that the metal oxide preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide in the CAC-OS may be particularly referred to as CAC-IGZO) has a composition in which materials are separated into indium oxide (hereinafter referred to as InO$_{X1}$ (X1 is a real number greater than 0)) or indium zinc oxide (hereinafter referred to as In$_{X2}$Zn$_{Y2}$O$_{Z2}$ (each of X2, Y2, and Z2 is a real number greater than 0)) and gallium oxide (hereinafter referred to as GaO$_{X3}$ (X3 is a real number greater than 0)), gallium zinc oxide (hereinafter referred to as Ga$_{X4}$Zn$_{Y4}$O$_{Z4}$ (each of X4, Y4, and Z4 is a real number greater than 0)), or the like so that a mosaic pattern is formed, and mosaic-like InO$_{X1}$ or In$_{X2}$Zn$_{Y2}$O$_{Z2}$ is evenly distributed in the film (this composition is hereinafter also referred to as a cloud-like composition).

That is, the CAC-OS is a composite metal oxide having a composition in which a region where GaO$_{X3}$ is a main component and a region where In$_{X2}$Zn$_{Y2}$O$_{Z2}$ or InO$_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by InGaO$_3$(ZnO)$_{m1}$ (m1 is a natural number) or In$_{(1+x0)}$Ga$_{(1-x0)}$O$_3$(ZnO)$_{m0}$ ($-1 \leq x0 \leq 1$; m0 is a given number).

The crystalline compound has a single crystal structure, a polycrystalline structure, or a CAAC structure. Note that the CAAC structure is a crystal structure in which a plurality of IGZO nanocrystals have c-axis alignment and are connected in an a-b plane without alignment.

Meanwhile, the CAC-OS relates to the material composition of a metal oxide. In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary between the region where GaO$_{X3}$ is a main component and the region where In$_{X2}$Zn$_{Y2}$O$_{Z2}$ or InO$_{X1}$ is a main component cannot be observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are each randomly dispersed in a mosaic pattern.

The CAC-OS can be formed by a sputtering method under a condition where a substrate is not heated intentionally, for example. In addition, in the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed at the time of measurement using θ/2θ scan by an Out-of-plane method, which is one of the X-ray diffraction (XRD) measurement methods. That is, it is found from X-ray diffraction measurement that no alignment in an a-b plane direction and a c-axis direction is observed in a measured region.

In addition, in an electron diffraction pattern of the CAC-OS that is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in a plan-view direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other, and the regions including the respective elements as the main components form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through regions where $In_{X2}Zn_{Y2}O_{Z2}$ or $InO_{X1}$ is a main component, the conductivity of a metal oxide is exhibited. Accordingly, when the regions where $In_{X2}Zn_{Y2}O_{Z2}$ or $InO_{X1}$ is a main component are distributed like a cloud in a metal oxide, high field-effect mobility (μ) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in a metal oxide, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, so that high on-state current (Ion) and high field-effect mobility (μ) can be achieved.

In addition, a semiconductor element using the CAC-OS has high reliability. Thus, the CAC-OS is suitable for a variety of semiconductor devices typified by a display.

In addition, since a transistor including the CAC-OS in a semiconductor layer has high field-effect mobility and high drive capability, the use of the transistor in a driver circuit, a typical example of which is a scan line driver circuit that generates a gate signal, can provide a display device with a narrow bezel width (also referred to a narrow bezel). Furthermore, with the use of the transistor in a signal line driver circuit that is included in a display device (particularly in a demultiplexer connected to an output terminal of a shift register included in a signal line driver circuit), a display device to which a small number of wirings are connected can be provided.

Furthermore, unlike a transistor including low-temperature polysilicon, the transistor including the CAC-OS in the semiconductor layer does not need a laser crystallization step. Thus, the manufacturing cost of a display device can be reduced even when the display device is formed using a large area substrate. In addition, the transistor including the CAC-OS in the semiconductor layer is preferably used for a driver circuit and a display portion in a large display device having high resolution such as ultra-high definition ("4K resolution," "4K2K," and "4K") or super high definition ("8K resolution," "8K4K," and "8K") because writing can be performed in a short time and display defects can be reduced.

Alternatively, silicon may be used for a semiconductor in which a channel of a transistor is formed. Although amorphous silicon may be used as silicon, silicon having crystallinity is particularly preferably used. For example, microcrystalline silicon, polycrystalline silicon, single crystal silicon, or the like is preferably used. In particular, polycrystalline silicon can be formed at a temperature lower than that for single crystal silicon and has higher field-effect mobility and higher reliability than amorphous silicon.

<Conductive Layer>

Examples of materials that can be used for conductive layers of a variety of wirings and electrodes and the like included in the display device in addition to a gate, a source, and a drain of a transistor include metals such as aluminum, titanium, chromium, nickel, copper, yttrium, zirconium, molybdenum, silver, tantalum, and tungsten and an alloy containing such a metal as its main component. Alternatively, a single layer or a stacked-layer structure including a film containing these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. In addition, copper containing manganese is preferably used because controllability of a shape by etching is increased.
<Insulating Layer>

Examples of an insulating material that can be used for each insulating layer include, in addition to a resin such as acrylic or epoxy and a resin having a siloxane bond, an inorganic insulating material such as silicon oxide, silicon oxynitride, silicon nitride oxide, silicon nitride, or aluminum oxide.

In addition, the light-emitting device is preferably provided between a pair of insulating films with low water permeability. In that case, impurities such as water can be inhibited from entering the light-emitting device, and a decrease in the reliability of the device can be inhibited.

Examples of the insulating film with low water permeability include a film containing nitrogen and silicon, such as a silicon nitride film and a silicon nitride oxide film, and a film containing nitrogen and aluminum, such as an aluminum nitride film. Alternatively, a silicon oxide film, a silicon oxynitride film, an aluminum oxide film, or the like may be used.

For example, the moisture vapor transmission rate of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

The above is the description of the components.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 3

In this embodiment, structure examples of a display device will be described using FIG. 23A to FIG. 23C.

Figure 23A:
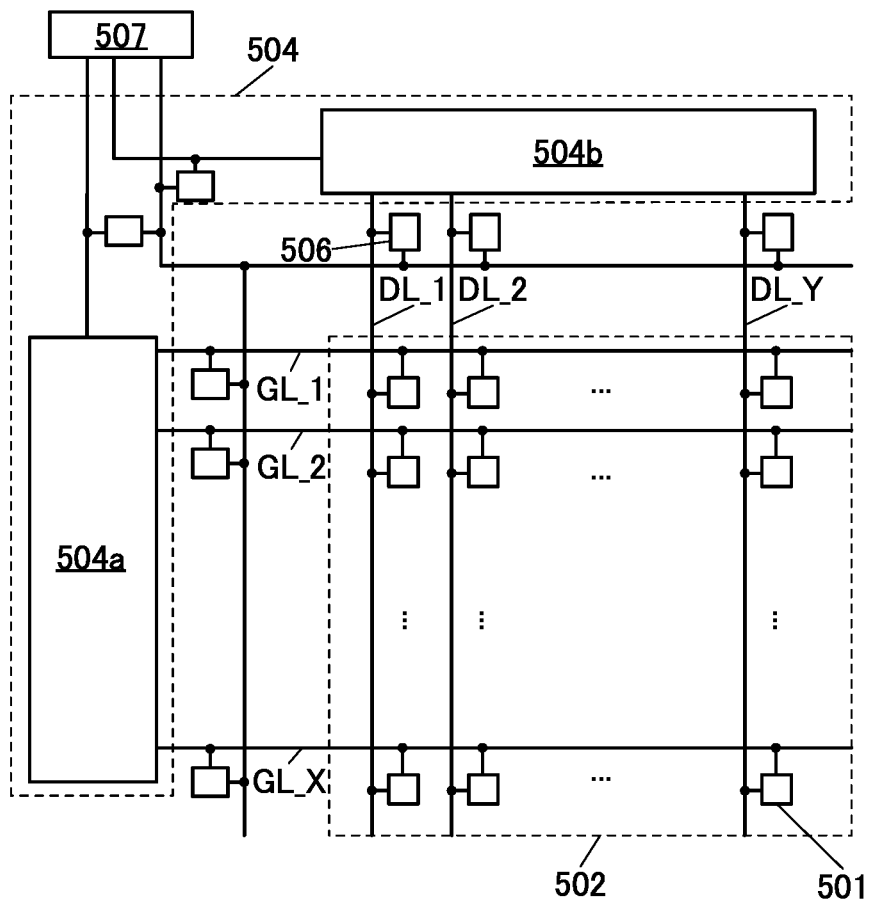
FIG. 23A is a block diagram of a display panel.

The display device illustrated in FIG. 23A includes a pixel portion 502, a driver circuit portion 504, protection circuits 506, and a terminal portion 507. Note that a structure in which the protection circuits 506 are not provided may be employed.

The pixel portion 502 includes a plurality of pixel circuits 501 that drive a plurality of display devices arranged in X rows and Y columns (X and Y each independently represent a natural number of 2 or more).

The driver circuit portion 504 includes driver circuits such as a gate driver 504a that outputs scan signals to gate lines GL_1 to GL_X and a source driver 504b that supplies data signals to data lines DL_1 to DL_Y. The gate driver 504a includes at least a shift register. In addition, the source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 23A is connected to a variety of wirings such as scan lines GL that are wirings between the gate driver 504a and the pixel circuits 501 and data lines DL that are wirings between the source driver 504b and the pixel circuits 501, for example.

In addition, the gate driver 504a and the source driver 504b may each be provided over the same substrate as the pixel portion 502, or a substrate over which a gate driver circuit or a source driver circuit is separately formed (e.g., a driver circuit board formed using a single crystal semiconductor film or a polycrystalline semiconductor film) may be mounted on the substrate by COF, TCP (Tape Carrier Package), COG (Chip On Glass), or the like.

Figure 23B:
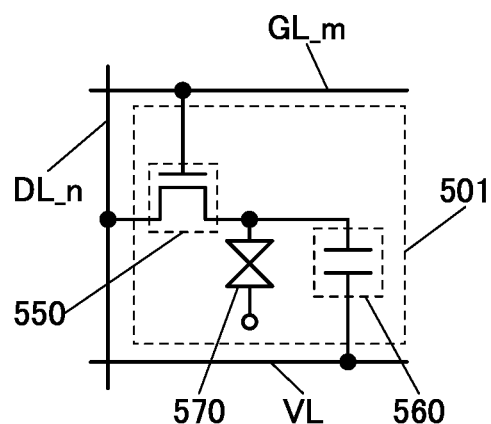
FIG. 23B and FIG. 23C are pixel circuit diagrams.
Figure 23C:
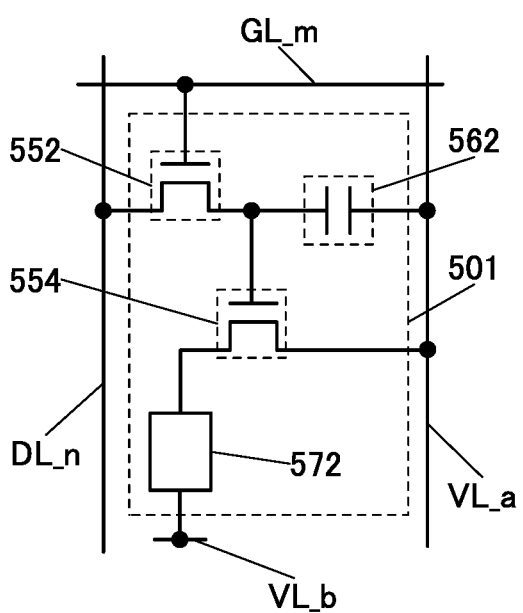

In addition, the plurality of pixel circuits 501 illustrated in FIG. 23A can have a structure illustrated in FIG. 23B or FIG. 23C, for example.

The pixel circuit 501 illustrated in FIG. 23B includes a liquid crystal device 570, a transistor 550, and a capacitor 560. In addition, the data line DL_n, the scan line GL_m, a potential supply line VL, and the like are connected to the pixel circuit 501.

The potential of one of a pair of electrodes of the liquid crystal device 570 is set as appropriate in accordance with the specifications of the pixel circuit 501. The alignment state of the liquid crystal device 570 is set depending on written data. Note that a common potential may be applied to one of the pair of electrodes of the liquid crystal device 570 included in each of the plurality of pixel circuits 501. Alternatively, a different potential may be applied to one of the pair of electrodes of the liquid crystal device 570 of the pixel circuit 501 in each row.

In addition, the pixel circuit 501 illustrated in FIG. 23C includes transistors 552 and 554, a capacitor 562, and a light-emitting device 572. Furthermore, the data line DL_n, the scan line GL_m, a potential supply line VL_a, a potential supply line VL_b, and the like are connected to the pixel circuit 501.

Note that a high power supply potential VDD is applied to one of the potential supply line VL_a and the potential supply line VL_b, and a low power supply potential VSS is applied to the other of the potential supply line VL_a and the potential supply line VL_b. Current flowing through the light-emitting device 572 is controlled in accordance with a potential applied to a gate of the transistor 554, so that the luminance of light emitted from the light-emitting device 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 4

A pixel circuit including a memory for correcting gray levels displayed by pixels and a display device including the pixel circuit will be described below.
<Circuit Structure>

Figure 24A:
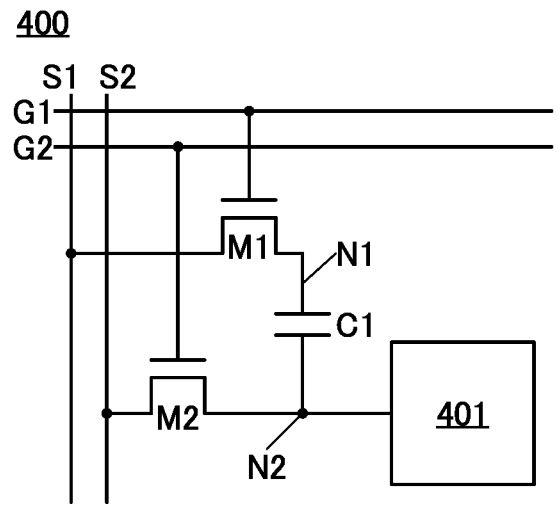
FIG. 24A, FIG. 24C, and FIG. 24D are pixel circuit diagrams.

FIG. 24A illustrates a circuit diagram of a pixel circuit 400. The pixel circuit 400 includes a transistor M1, a transistor M2, a capacitor C1, and a circuit 401. In addition, a wiring S1, a wiring S2, a wiring G1, and a wiring G2 are connected to the pixel circuit 400.

In the transistor M1, a gate is connected to the wiring G1, one of a source and a drain is connected to the wiring S1, and the other of the source and the drain is connected to one electrode of the capacitor C1. In the transistor M2, a gate is connected to the wiring G2, one of a source and a drain is connected to the wiring S2, and the other of the source and the drain is connected to the other electrode of the capacitor C1 and the circuit 401.

The circuit 401 is a circuit including at least one display device. A variety of devices can be used as the display device, and typically, a light-emitting device such as an organic EL device or an LED device, a liquid crystal device, a MEMS (Micro Electro Mechanical Systems) device, or the like can be employed.

A node connecting the transistor M1 and the capacitor C1 is denoted as a node N1, and a node connecting the transistor M2 and the circuit 401 is denoted as a node N2.

In the pixel circuit 400, the potential of the node N1 can be retained when the transistor M1 is set in an off state. In addition, the potential of the node N2 can be retained when the transistor M2 is set in an off state. Furthermore, when a predetermined potential is written to the node N1 through the transistor M1 with the transistor M2 being in an off state, the potential of the node N2 can be changed in accordance with displacement in the potential of the node N1 owing to capacitive coupling through the capacitor C1.

Here, the transistor employing an oxide semiconductor, which is illustrated in Embodiment 1, can be used as one or both of the transistor M1 and the transistor M2. Accordingly, owing to extremely low off-state current, the potentials of the node N1 and the node N2 can be retained over a long period. Note that in the case where the period in which the potential of each node is retained is short (specifically, the case where frame frequency is higher than or equal to 30 Hz, for example), a transistor employing a semiconductor such as silicon may be used.

Driving Method Example

Figure 24B:
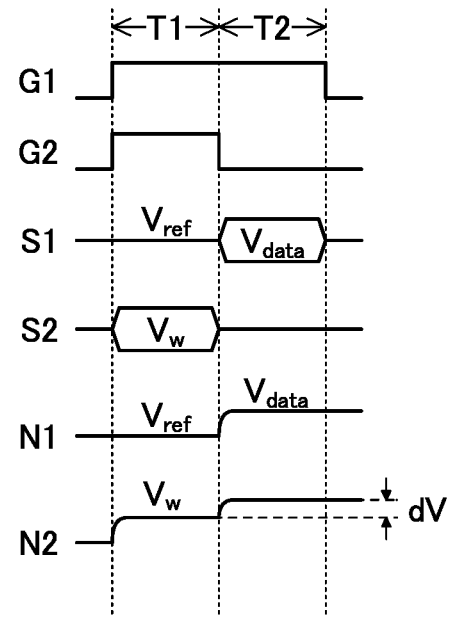
FIG. 24B is a timing chart showing pixel operation.

Next, an example of a method for operating the pixel circuit 400 is described using FIG. 24B. FIG. 24B is a timing chart of the operation of the pixel circuit 400. Note that for simplification of the description, the influence of various kinds of resistance such as wiring resistance, parasitic capacitance of a transistor, a wiring, or the like, the threshold voltage of the transistor, and the like is not taken into account here.

In the operation shown in FIG. 24B, one frame period is divided into a period T1 and a period T2. The period T1 is a period in which a potential is written to the node N2, and the period T2 is a period in which a potential is written to the node N1.

In the period T1, a potential for setting the transistor in an on state is applied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is applied from the wiring S1 to the node N1 through the transistor M1. In addition, the first data potential $V_w$ is applied from the wiring S2 to the node N2 through the transistor M2. Accordingly, a potential difference $V_w - V_{ref}$ is retained in the capacitor C1.

Next, in the period T2, a potential for setting the transistor M1 in an on state is applied to the wiring G1, and a potential for setting the transistor M2 in an off state is applied to the wiring G2. In addition, a second data potential $V_{data}$ is supplied to the wiring S1. The wiring S2 may be supplied with a predetermined constant potential or brought into a floating state.

The second data potential $V_{data}$ is applied from the wiring S1 to the node N1 through the transistor M1. In that case, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although dV is shown as a positive value in FIG. 24B, dV may be a negative value. That is, the potential $V_{data}$ may be lower than the potential $V_{ref}$.

Here, the potential dV is roughly determined by the capacitance value of the capacitor C1 and the capacitance value of the circuit 401. In the case where the capacitance value of the capacitor C1 is sufficiently larger than the capacitance value of the circuit 401, the potential dV is a potential close to the second data potential $V_{data}$.

As described above, a potential to be supplied to the circuit 401 including the display device can be generated by a combination of two kinds of data signals in the pixel circuit 400, so that gray levels can be corrected in the pixel circuit 400.

In addition, in the pixel circuit 400, it is also possible to generate a potential exceeding the maximum potential that can be supplied to the wiring S1 and the wiring S2. For example, in the case where a light-emitting device is used, high-dynamic range (HDR) display or the like can be performed. Furthermore, in the case where a liquid crystal device is used, overdriving or the like can be achieved.

Application Example

[Example Using Liquid Crystal Device]

Figure 24C:
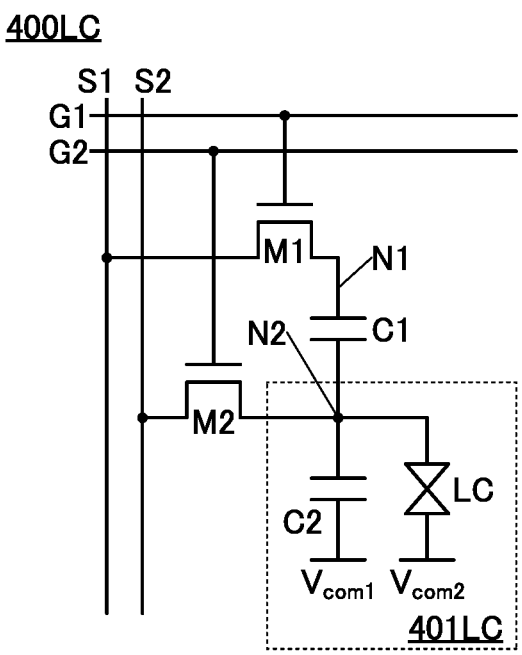

A pixel circuit 400LC illustrated in FIG. 24C includes a circuit 401LC. The circuit 401LC includes a liquid crystal device LC and a capacitor C2.

In the liquid crystal device LC, one electrode is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, high voltage can be supplied to the liquid crystal device LC; thus, high-speed display can be performed by overdriving or a liquid crystal material with high drive voltage can be employed, for example. In addition, gray levels can also be corrected in accordance with operating temperature, the degradation state of the liquid crystal device LC, or the like by supply of a correction signal to the wiring S1 or the wiring S2.

[Example Using Light-Emitting Device]

Figure 24D:
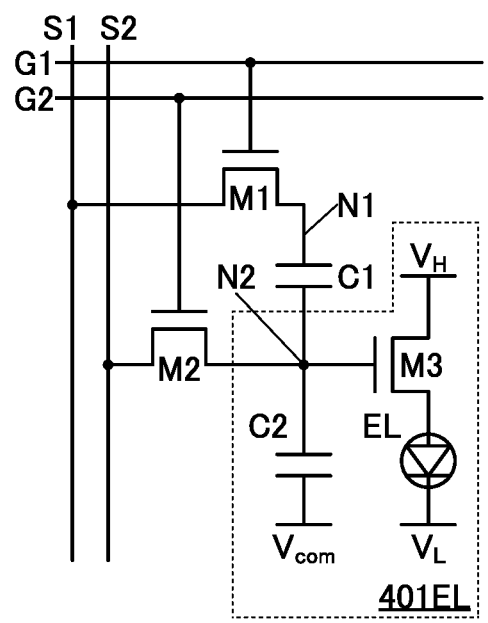

A pixel circuit 400EL illustrated in FIG. 24D includes a circuit 401EL. The circuit 401EL includes a light-emitting device EL, a transistor M3, and the capacitor C2.

In the transistor M3, a gate is connected to the node N2 and one electrode of the capacitor C2, one of a source and a drain is connected to a wiring supplied with a potential $V_H$, and the other of the source and the drain is connected to one electrode of the light-emitting device EL. The other electrode of the capacitor C2 is connected to a wiring supplied with a potential $V_{com}$. The other electrode of the light-emitting device EL is connected to a wiring supplied with a potential $V_L$.

The transistor M3 has a function of controlling current to be supplied to the light-emitting device EL. The capacitor C2 functions as a storage capacitor. The capacitor C2 can be omitted when not needed.

Note that although a structure in which the anode side of the light-emitting device EL is connected to the transistor M3 is described here, the transistor M3 may be connected to the cathode side. In that case, the values of the potential $V_H$ and the potential $V_L$ can be changed as appropriate.

In the pixel circuit 400EL, a large amount of current can flow through the light-emitting device EL when a high potential is applied to the gate of the transistor M3, which enables HDR display or the like, for example. Moreover, a variation in electrical characteristics of the transistor M3 and the light-emitting device EL can also be corrected by supply of a correction signal to the wiring S1 or the wiring S2.

Note that the structure is not limited to the circuits illustrated in FIG. 24C and FIG. 24D, and a structure to which a transistor, a capacitor, or the like is further added may be employed.

At least part of this embodiment can be implemented in combination with the other embodiments described in this specification as appropriate.

Embodiment 5

In this embodiment, structure examples of a pixel of a display panel according to one embodiment of the present invention will be described below.

Structure examples of a pixel 300 are illustrated in FIG. 25A to FIG. 25E.

The pixel 300 includes a plurality of pixels 301. The plurality of pixels 301 each function as a subpixel. One pixel 300 is formed of the plurality of pixels 301 exhibiting different colors, and thus full-color display can be achieved in a display portion.

Figure 25A:
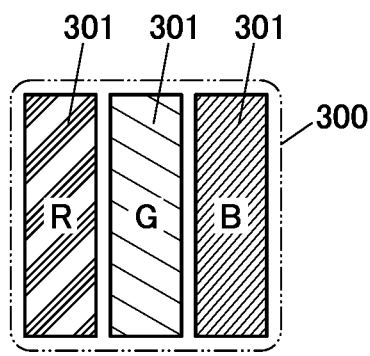
FIG. 25A, FIG. 25B, FIG. 25C, FIG. 25D, and FIG. 25E are diagrams each illustrating a pixel structure example.
Figure 25B:
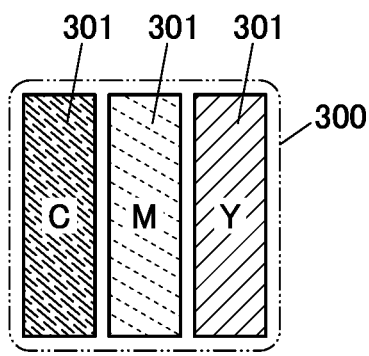

The pixels 300 illustrated in FIG. 25A and FIG. 25B each include three subpixels. The combination of colors exhibited by the pixels 301 included in the pixel 300 illustrated in FIG. 25A is red (R), green (G), and blue (B). The combination of colors exhibited by the pixels 301 included in the pixel 300 illustrated in FIG. 25B is cyan (C), magenta (M), and yellow (Y).

Figure 25C:
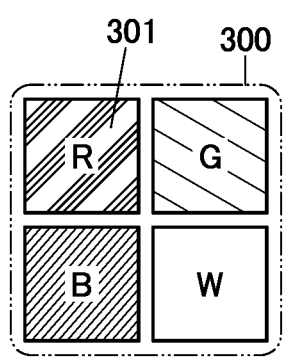
Figure 25D:
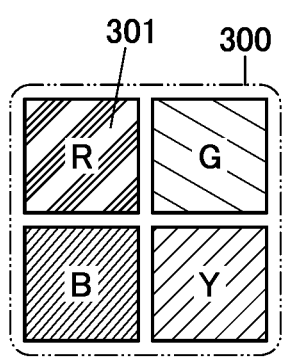
Figure 25E:
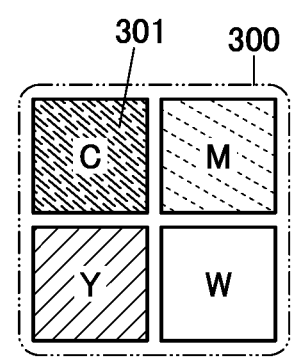

The pixels 300 illustrated in FIG. 25C to FIG. 25E each include four subpixels. The combination of colors exhibited by the pixels 301 included in the pixel 300 illustrated in FIG. 25C is red (R), green (G), blue (B), and white (W). The use of the subpixel that exhibits white can increase the luminance of the display portion. The combination of colors exhibited by the pixels 301 included in the pixel 300 illustrated in FIG. 25D is red (R), green (G), blue (B), and yellow (Y). The combination of colors exhibited by the pixels 301 included in the pixel 300 illustrated in FIG. 25E is cyan (C), magenta (M), yellow (Y), and white (W).

When subpixels that exhibit red, green, blue, cyan, magenta, yellow, and the like are combined as appropriate with more subpixels functioning as one pixel, the reproducibility of halftones can be increased. Thus, display quality can be increased.

In addition, the display device according to one embodiment of the present invention can reproduce the color gamut of various standards. For example, the display device according to one embodiment of the present invention can reproduce the color gamut of the PAL (Phase Alternating Line) standard and the NTSC (National Television System Committee) standard used for TV broadcasting; the sRGB (standard RGB) standard and the Adobe RGB standard widely used for display devices used in electronic devices such as personal computers, digital cameras, and printers; the ITU-R BT.709 (International Telecommunication Union Radiocommunication Sector Broadcasting Service (Television) 709) standard used for HDTV (High Definition Television, also referred to Hi-Vision); the DCI-P3 (Digital Cinema Initiatives P3) standard used for digital cinema projection; the ITU-R BT.2020 (REC.2020 (Recommendation 2020)) standard used for UHDTV (Ultra High Definition Television, also referred to as Super Hi-Vision); and the like.

In addition, by arranging the pixels 300 in a matrix of 1920×1080, a display device that can perform full-color display with a resolution of what is called full high definition (also referred to as "2K resolution," "2K1K," "2K," or the like) can be achieved. Alternatively, for example, by arranging the pixels 300 in a matrix of 3840×2160, a display device that can perform full-color display with a resolution of what is called ultra high definition (also referred to as "4K resolution," "4K2K," "4K," or the like) can be achieved. Alternatively, for example, by arranging the pixels 300 in a matrix of 7680×4320, a display device that can perform full-color display with a resolution of what is called super high definition (also referred to as "8K resolution," "8K4K," "8K," or the like) can be achieved. By increasing the number of pixels 300, a display device that can perform full-color display with 16K or 32K resolution can also be achieved.

At least part of this embodiment can be implemented in combination with the other embodiments described in this specification as appropriate.

REFERENCE NUMERALS

10: hinge, 11a: blade, 11b: blade, 12a: shaft, 12b: shaft, 13a: shaft, 13b: shaft, 14: spindle, 15: spindle, 16: pin, 17: stopper, 19: jig, 20: hinge, 21: columnar body, 22: slotted hole, 23: stopper, 24: backing plate, 25: hole portion, 26: hollow portion, 27: spring, 28: ball, 29: lock part, 30: notch portion, 31: region, 41a: shaft, 41b: shaft, 42: shaft, 45: spindle, 46: pin, 100A: support, 100B: support, 101a: hinge portion, 101b: hinge portion, 102a: housing, 102b: housing, 102c: housing, 103: display panel, 103a: region, 103b: region, 103c: region, 104a: curved surface, 104b: curved surface, 115: columnar body, 116a: gear, 116b: gear, 120: sensor, 130: image, 131: keyboard, 132: icon, 135a: input/output unit, 135b: input/output unit, 136a: camera, 136b: camera, 137: sensor, 138: display panel, 139: display panel, 140: solar battery, 141: thin-film solar battery, 145: external interface, 146: transceiving unit, 147: speaker, 148: camera, 149: microphone, 150: stylus, 200: display device, 210: display device, 300: pixel, 301: pixel, 400: pixel circuit, 400EL: pixel circuit, 400LC: pixel circuit, 401: circuit, 401EL: circuit, 401LC: circuit, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal device, 572: light-emitting device, 700: display panel, 700A: display panel, 702: pixel portion, 704: source driver circuit portion, 706: gate driver circuit portion, 708: FPC terminal portion, 710: wiring, 716: FPC, 717: IC, 730: insulating layer, 732: sealing layer, 736: coloring layer, 738: light-blocking layer, 740: support substrate, 741: protective layer, 741a: insulating layer, 741b: insulating layer, 741c: insulating layer, 742: adhesive layer, 743: resin layer, 744: insulating layer, 745: support substrate, 746: insulating layer, 747: adhesive layer, 749: protective layer, 750: transistor, 752: transistor, 760:

wiring, 761: conductive layer, 770: insulating layer, 772: conductive layer, 780: anisotropic conductive film, 782: light-emitting device, 786: EL layer, 788: conductive layer, and 790: capacitor.

The invention claimed is:

1. A flexible component support comprising:
a first housing;
a second housing;
a first joint; and
a second joint,
wherein the first housing and the second housing are coupled to each other through the first joint and the second joint,
wherein the first joint and the second joint have an overlap region,
wherein the first joint and the second joint each include a movable portion,
wherein the first joint includes a plurality of first columnar bodies,
wherein the plurality of first columnar bodies are coupled to each other so that first surfaces of the plurality of first columnar bodies form a continuous surface,
wherein the second joint is a hinge,
wherein a maximum opening angle of the hinge is approximately 180°, and
wherein, when the opening angle is 180°, second surfaces of the plurality of first columnar bodies opposite of the first surfaces of the plurality of first columnar bodies face a first surface of the second joint.

2. The flexible component support according to claim 1,
wherein a second columnar body including a major axis substantially perpendicular to the first surface of one of the plurality of first columnar bodies is fixed to the one of the plurality of first columnar bodies and the hinge,
wherein the hinge includes a notch portion, and
wherein when the opening angle of the hinge is approximately 180°, part of the second columnar body is positioned in the notch portion.

3. The flexible component support according to claim 1,
wherein the hinge comprises a first blade and a second blade,
wherein a first end portion of a second columnar body including a major axis substantially perpendicular to the first surface of one of the plurality of first columnar bodies is fixed to the one of the plurality of first columnar bodies,
wherein the hinge includes a plurality of shafts,
wherein the first blade is fixed to one of the plurality of shafts,
wherein the second blade is not fixed to the one of the plurality of shafts, and
wherein a second end portion in the major axis direction of the second columnar body is fixed to the one of the plurality of shafts.

4. A display device comprising:
the flexible component support according to claim 1, and
a flexible display panel.

5. The display device according to claim 4, wherein the flexible display panel includes a light-emitting device.

6. A flexible component support comprising:
a first housing;
a second housing;
a first joint; and
a second joint,
wherein the first housing and the second housing are coupled to each other through the first joint and the second joint,
wherein the first joint and the second joint have an overlap region,
wherein the first joint and the second joint each include a movable portion,
wherein the first joint includes a plurality of first columnar bodies,
wherein the plurality of first columnar bodies are coupled to each other so that first surfaces of the plurality of first columnar bodies and first surfaces of the first housing and the second housing form a continuous surface,
wherein the second joint is a hinge comprising a first blade and a second blade,
wherein a maximum opening angle of the hinge is approximately 180°, and
wherein the second joint is fixed to a second surface of the first housing opposite of the first surface of the first housing.

7. A flexible component support comprising:
a first housing;
a second housing;
a first joint; and
a second joint,
wherein the first housing and the second housing are connected to each other through the first joint and the second joint,
wherein the first joint and the second joint have an overlap region,
wherein the first joint and the second joint each include a movable portion,
wherein the first joint includes a plurality of first columnar bodies,
wherein the plurality of first columnar bodies are coupled to each other so that first surfaces of the plurality of first columnar bodies form a continuous surface,
wherein the second joint is a hinge, and
wherein, in an opened state of the flexible component support, the second joint comprises a region overlapping with the first housing and not overlapping with the first joint.

8. The flexible component support according to claim 7,
wherein the hinge comprises a first blade and a second blade,
wherein a second columnar body is fixed to one of the plurality of first columnar bodies and the hinge,
wherein the hinge includes a notch portion, and
wherein when a first surface of the first housing and a first surface of the second housing are aligned with each other, part of the second columnar body is positioned in the notch portion.

9. The flexible component support according to claim 7,
wherein the hinge comprises a first blade and a second blade,
wherein a first end portion of a second columnar body is fixed to one of the plurality of first columnar bodies,
wherein the hinge includes a plurality of shafts,
wherein the first blade is fixed to one of the plurality of shafts,
wherein the second blade is not fixed to the one of the plurality of shafts, and
wherein a second end portion of the second columnar body is fixed to the one of the plurality of shafts.

* * * * *